United States Patent
Suzuki et al.

(10) Patent No.: US 12,185,636 B2
(45) Date of Patent: Dec. 31, 2024

(54) PIEZOELECTRIC DEVICE INCLUDING BASE PORTION AND MEMBRANE PORTION

(71) Applicant: Murata Manufacturing Co., Ltd., Nagaokakyo (JP)

(72) Inventors: Masayuki Suzuki, Nagaokakyo (JP); Shinsuke Ikeuchi, Nagaokakyo (JP); Fumiya Kurokawa, Nagaokakyo (JP); Yutaka Kishimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 723 days.

(21) Appl. No.: 17/506,921

(22) Filed: Oct. 21, 2021

(65) Prior Publication Data
US 2022/0045261 A1 Feb. 10, 2022

Related U.S. Application Data

(63) Continuation of application No. PCT/JP2020/011693, filed on Mar. 17, 2020.

(30) Foreign Application Priority Data

May 16, 2019 (JP) .................................. 2019-092680

(51) Int. Cl.
 H10N 30/87 (2023.01)
 H10N 30/00 (2023.01)
(52) U.S. Cl.
 CPC ......... H10N 30/871 (2023.02); H10N 30/708 (2024.05)

(58) Field of Classification Search
CPC .. H10N 30/871; H10N 30/708; H10N 30/073; H10N 30/2047; H03H 2003/023; H03H 3/02; H03H 9/02015; H03H 9/174
See application file for complete search history.

(56) References Cited

U.S. PATENT DOCUMENTS

| | | | |
|---|---|---|---|
| 10,771,031 B2* | 9/2020 | Hurwitz | ............ H03H 9/02401 |
| 2016/0023904 A1* | 1/2016 | Hart | .................... B81C 1/00626 |
| | | | 427/249.15 |

FOREIGN PATENT DOCUMENTS

| | | | |
|---|---|---|---|
| JP | 2000-144384 A | | 5/2000 |
| JP | 2004-230790 A | | 8/2004 |

(Continued)

OTHER PUBLICATIONS

Official Communication issued in International Patent Application No. PCT/JP2020/011693, mailed on May 26, 2020.

*Primary Examiner* — Emily P Pham
(74) *Attorney, Agent, or Firm* — Keating & Bennett, LLP

(57) ABSTRACT

A piezoelectric device includes a membrane portion including a single-crystal piezoelectric layer, an upper electrode layer, and a lower electrode layer. The upper electrode layer is on a first surface. The lower electrode layer is on a second surface facing at least a portion of the upper electrode layer sandwiching the single-crystal piezoelectric layer. The single-crystal piezoelectric layer includes piezoelectric body cleavage directions extending along a boundary line between a cleavage plane occurring when the single-crystal piezoelectric layer is cleaved and the first surface. When viewed in a vertical direction, at least a portion of an upper electrode outer edge and at least a portion of a lower electrode outer edge are non-parallel to at least one of the piezoelectric body cleavage directions.

20 Claims, 12 Drawing Sheets

(56) References Cited

FOREIGN PATENT DOCUMENTS

| | | |
|---|---|---|
| JP | 2007-063574 A | 3/2007 |
| JP | 2009-010367 A | 1/2009 |
| JP | 2013-065940 A | 4/2013 |
| JP | 2016-134434 A | 7/2016 |

* cited by examiner

PIEZOELECTRIC DEVICE INCLUDING BASE PORTION AND MEMBRANE PORTION

CROSS REFERENCE TO RELATED APPLICATIONS

This application claims the benefit of priority to Japanese Patent Application No. 2019-092680 filed on May 16, 2019 and is a Continuation Application of PCT Application No. PCT/JP2020/011693 filed on Mar. 17, 2020. The entire contents of each application are hereby incorporated herein by reference.

BACKGROUND OF THE INVENTION

1. Field of the Invention

The present invention relates to a piezoelectric device.

2. Description of the Related Art

Some piezoelectric devices include a multilayer film. Japanese Unexamined Patent Application Publication No. 2000-144384 and Japanese Unexamined Patent Application Publication No. 2007-63574 disclose a film formation method of a multilayer film. Japanese Unexamined Patent Application Publication No. 2000-144384 discloses a method for manufacturing a low-stress Mo vapor deposited film in a process for producing Mo emitters used for field-emission displays, that is, a manufacturing method of a low-stress Mo vapor deposited film characterized in that a Mo vapor deposited film is manufactured by introducing $H_2O$ or $N_2$ during Mo vapor deposition. Japanese Unexamined Patent Application Publication No. 2007-63574 discloses a film formation method of a multilayer film, that is, a film formation method characterized by including a step of forming a vapor deposited film exhibiting compressive stress by normal vapor deposition without using plasma, and a step of forming a vapor deposited film exhibiting tensile stress by vapor deposition using plasma.

A film formation method of a multilayer film for suppressing the occurrence of delamination or cracks has been studied. Japanese Unexamined Patent Application Publication No. 2000-144384 discloses a film formation method for reducing the stress of each multilayer film. Japanese Unexamined Patent Application Publication No. 2007-63574 discloses a film formation method for reducing the stress of the entire multilayer film by laminating a film exhibiting compressive stress and a film exhibiting tensile stress to each other.

Here, in a piezoelectric device including a single-crystal piezoelectric layer, cracking due to cleavage of the single-crystal piezoelectric layer is likely to occur. For this reason, in a piezoelectric device including a single-crystal piezoelectric layer, it is difficult to sufficiently suppress the occurrence of cracking due to cleavage of the single-crystal piezoelectric layer only by manufacturing with an existing film formation method for suppressing the occurrence of delamination or cracks.

SUMMARY OF THE INVENTION

Preferred embodiments of the present invention provide piezoelectric devices that are each able to reduce or prevent the occurrence of cracking due to cleavage of a single-crystal piezoelectric layer.

A piezoelectric device according to a preferred embodiment of the present invention includes a base portion and a membrane portion. The membrane portion includes a plurality of layers. The membrane portion is indirectly supported by the base portion and positioned above the base portion. The membrane portion does not overlap the base portion. The membrane portion includes a single-crystal piezoelectric layer, an upper electrode layer, and a lower electrode layer. The single-crystal piezoelectric layer includes a first surface and a second surface. The first surface faces upward. The second surface is on a side opposite to the first surface in a vertical direction. The single-crystal piezoelectric layer is made of lithium tantalate or lithium niobate. The upper electrode layer is on the first surface. The lower electrode layer is on the second surface so as to face at least a portion of the upper electrode layer, sandwiching the single-crystal piezoelectric layer in between. The single-crystal piezoelectric layer includes a plurality of piezoelectric body cleavage directions extending along a boundary line between a cleavage plane occurring when the single-crystal piezoelectric layer is cleaved and the first surface. When viewed in the vertical direction, at least a portion of an upper electrode outer edge that is an outer edge of the upper electrode layer and at least a portion of a lower electrode outer edge that is an outer edge of the lower electrode layer are non-parallel to at least one direction of the plurality of piezoelectric body cleavage directions.

A piezoelectric device according to a preferred embodiment of the present invention includes a base portion and a membrane portion. The membrane portion includes a plurality of layers. The membrane portion is indirectly supported by the base portion and positioned above the base portion. The membrane portion does not overlap the base portion. The membrane portion includes a single-crystal piezoelectric layer, an upper electrode layer, and a lower electrode layer. The single-crystal piezoelectric layer includes a first surface and a second surface. The first surface faces upward. The second surface is on a side opposite to the first surface in a vertical direction. The single-crystal piezoelectric layer is made of lithium tantalate or lithium niobate. The upper electrode layer is on the first surface. The lower electrode layer is on the second surface so as to face at least a portion of the upper electrode layer, sandwiching the single-crystal piezoelectric layer in between. The single-crystal piezoelectric layer includes a plurality of piezoelectric body cleavage directions extending along a boundary line between a cleavage plane occurring when the single-crystal piezoelectric layer is cleaved and the first surface. At least one of the base portion and the membrane portion includes a single-crystal silicon layer. The single-crystal silicon layer includes an upper surface facing upward. The single-crystal silicon layer includes a plurality of silicon cleavage directions extending along a boundary line between a cleavage plane occurring when the single-crystal silicon layer is cleaved and the upper surface. At least one direction of the plurality of piezoelectric body cleavage directions is non-parallel to each of the plurality of silicon cleavage directions.

According to preferred embodiments of the present invention, the occurrence of cracking due to cleavage of the single-crystal piezoelectric layer can be suppressed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
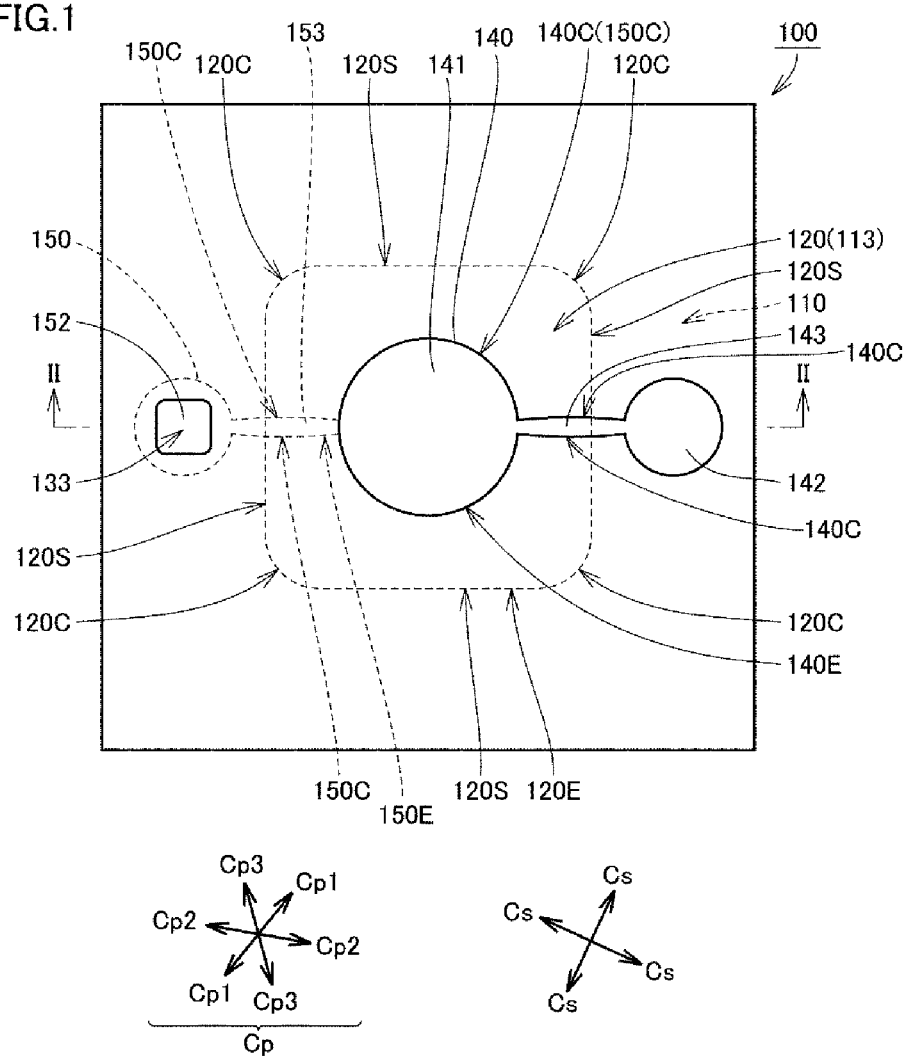
FIG. 1 is a plan view of a piezoelectric device according to Preferred Embodiment 1 of the present invention.

Hereinafter, piezoelectric devices according to preferred embodiments of the present invention will be described in detail with reference to the drawings. In the following description of the preferred embodiments, the same or corresponding portions in the drawings are denoted by the same reference numerals, and the description thereof will not be repeated.

Preferred Embodiment 1

Figure 2:
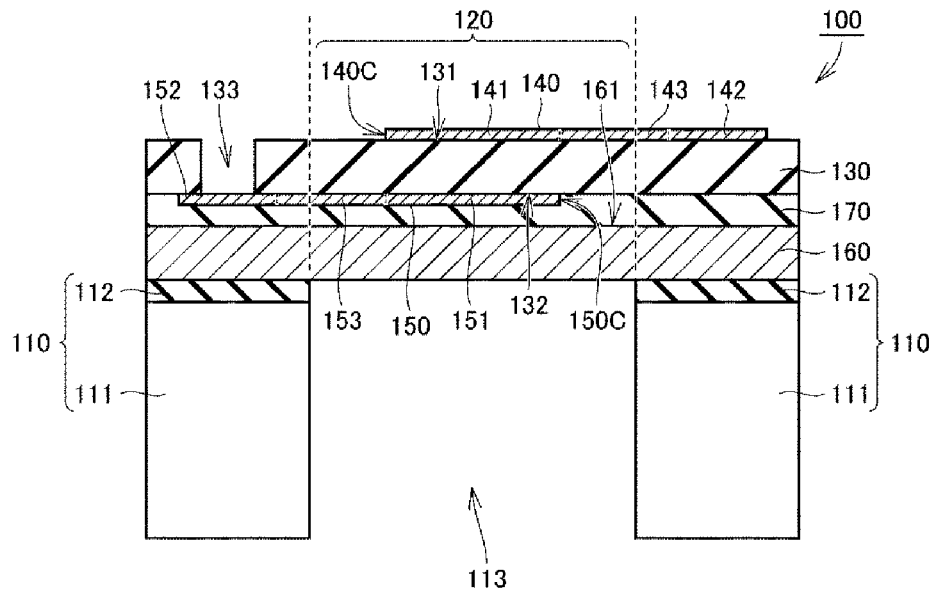
FIG. 2 is a cross-sectional view of the piezoelectric device of FIG. 1 as viewed in a direction of line II-II.

FIG. 1 is a plan view of a piezoelectric device according to Preferred Embodiment 1 of the present invention. FIG. 2 is a cross-sectional view of the piezoelectric device of FIG. 1 as viewed in a direction of a line II-II.

As illustrated in FIG. 1 and FIG. 2, a piezoelectric device 100 according to the present preferred embodiment includes a base portion 110 and a membrane portion 120.

As illustrated in FIG. 2, the base portion 110 includes a first single-crystal silicon layer 111 and a box layer 112. The box layer 112 is positioned above the first single-crystal silicon layer 111. In the present preferred embodiment, the box layer 112 is made of, for example, $SiO_2$. Note that the base portion 110 may include a layer made of a material other than single-crystal silicon, instead of the first single-crystal silicon layer 111.

In the base portion 110, a cavity 113 penetrating through the first single-crystal silicon layer 111 and the box layer 112 in the vertical direction is provided. Note that the cavity 113 may not penetrate through the box layer 112. In the case where the cavity 113 does not penetrate through the box layer 112, a portion of the box layer 112 positioned above the cavity 113 is included in the membrane portion 120.

As illustrated in FIG. 2, a plurality of layers is laminated on an upper surface of the base portion 110. The membrane portion 120 is a portion of the plurality of layers positioned above the cavity 113. That is, the membrane portion 120 includes a plurality of layers.

The membrane portion 120 is positioned above the cavity 113 of the base portion 110, and thus does not overlap the base portion 110. That is, the membrane portion 120 is indirectly supported by the base portion 110 and is positioned above the base portion 110.

As illustrated in FIG. 1, when viewed in the vertical direction, the base portion 110 has an annular outer shape with the cavity 113 as an inner portion. Therefore, when viewed in the vertical direction, the membrane portion 120 is positioned so as to be surrounded by the base portion 110.

In the present preferred embodiment, the cavity 113 has a rectangular or substantially rectangular outer shape when viewed in the vertical direction. Specifically, the cavity 113 has a square or substantially square outer shape, for example. When viewed in the vertical direction, a corner portion of the outer shape of the cavity 113 is rounded. Here, when viewed in the vertical direction, the outer shape of an outer edge 120E of the membrane portion 120 is the same or substantially the same as the outer shape of the cavity 113. Therefore, when viewed in the vertical direction, the outer edge 120E of the membrane portion 120 has a rectangular or substantially rectangular outer shape. To be specific, the outer edge 120E of the membrane portion 120 has a square or substantially square shape, for example. When viewed in the vertical direction, a corner portion of the outer edge 120E of the membrane portion 120 is rounded.

That is, in the present preferred embodiment, when viewed in the vertical direction, the outer edge 120E of the membrane portion 120 includes a plurality of membrane curved portions 120C and a plurality of membrane straight portions 120S. To be specific, each of the plurality of corner portions of the outer edge 120E of the membrane portion 120 is formed by the membrane curved portion 120C. Each of a plurality of side portions of the outer edge 120E of the membrane portion 120 is formed by the membrane straight portion 120S.

Note that the outer edge 120E of the membrane portion 120 may include only the plurality of membrane curved portions 120C. For example, the outer edge 120E of the membrane portion 120 may have a circular or substantially circular shape when viewed in the vertical direction.

As illustrated in FIG. 1 and FIG. 2, in the present preferred embodiment, the plurality of layers of the membrane portion 120 described above include a single-crystal piezoelectric layer 130, an upper electrode layer 140, a lower electrode layer 150, and a second single-crystal silicon layer 160.

As illustrated in FIG. 2, the single-crystal piezoelectric layer 130 is positioned above the base portion 110. The single-crystal piezoelectric layer 130 includes a first surface 131 and a second surface 132. The first surface 131 faces upward. The second surface 132 is on the side opposite to the first surface 131 in the vertical direction. The single-crystal piezoelectric layer 130 is arranged so that a portion of the single-crystal piezoelectric layer 130 is included in the membrane portion 120.

The single-crystal piezoelectric layer 130 includes a through-hole 133. The through-hole 133 vertically or substantially vertically penetrates through the single-crystal piezoelectric layer 130. In the present preferred embodiment, the through-hole 133 is positioned above the base portion 110 and is not included in the membrane portion 120.

The single-crystal piezoelectric layer 130 is made of, for example, lithium tantalate or lithium niobate. A thickness of the single-crystal piezoelectric layer 130 is, for example, about several μm.

Figure 3:
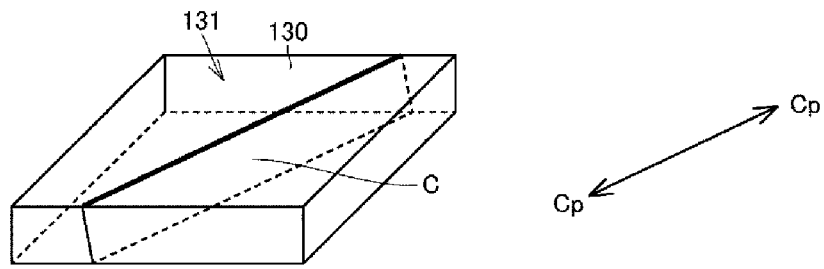
FIG. 3 is a perspective view schematically illustrating a state in the case where a cleavage plane occurs in a single-crystal piezoelectric layer in the piezoelectric device according to Preferred Embodiment 1 of the present invention.

In addition, the single-crystal piezoelectric layer 130 made of lithium tantalate or lithium niobate has a property of being easily cleaved. FIG. 3 is a perspective view schematically illustrating a state in the case where a cleavage plane occurs in a single-crystal piezoelectric layer in the piezoelectric device according to Preferred Embodiment 1 of the present invention. FIG. 3 schematically illustrates only the single-crystal piezoelectric layer 130 of the piezoelectric device 100. As illustrated in FIG. 3, in the present preferred embodiment, in the case where the single-crystal piezoelectric layer 130 is cleaved, a cleavage plane C extending in a direction intersecting with an in-plane direction of the first surface 131 occurs. A piezoelectric body cleavage direction Cp when such the cleavage plane C occurs in the single-crystal piezoelectric layer 130 is defined as a direction extending along a boundary line between the first surface 131 and the cleavage plane C.

Figure 4:
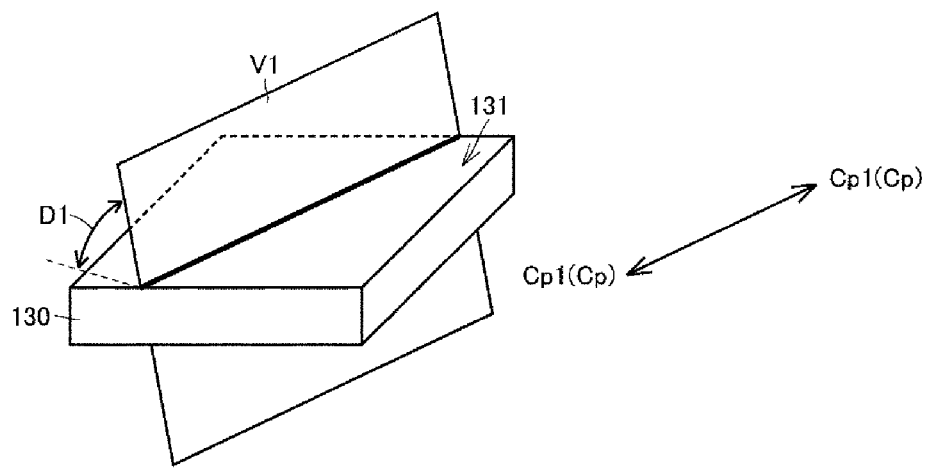
FIG. 4 is a perspective view schematically illustrating a first virtual plane obtained by extending a first cleavage plane, which is one of a plurality of cleavage planes that can occur in the single-crystal piezoelectric layer, in the piezoelectric device according to Preferred Embodiment 1 of the present invention.
Figure 5:
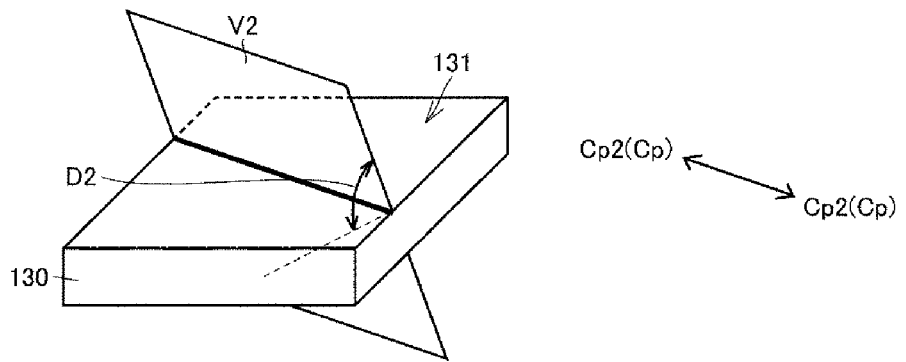
FIG. 5 is a perspective view schematically illustrating a second virtual plane obtained by extending a second cleavage plane, which is one of the plurality of cleavage planes that can occur in the single-crystal piezoelectric layer, in the piezoelectric device according to Preferred Embodiment 1 of the present invention.
Figure 6:
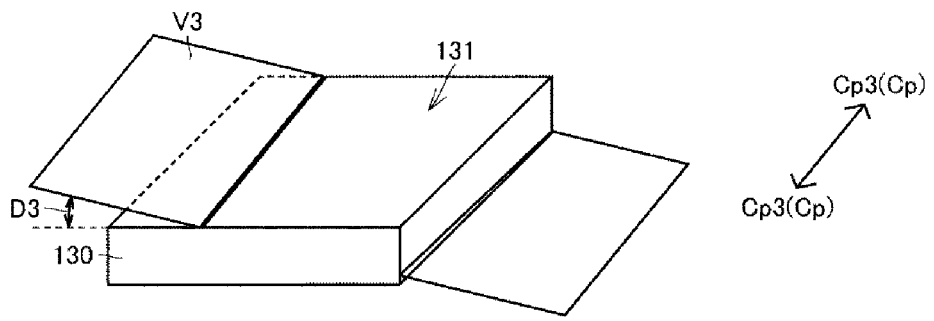
FIG. 6 is a perspective view schematically illustrating a third virtual plane obtained by extending a third cleavage plane, which is one of the plurality of cleavage planes that can occur in the single-crystal piezoelectric layer, in the piezoelectric device according to Preferred Embodiment 1 of the present invention.
Figure 7:
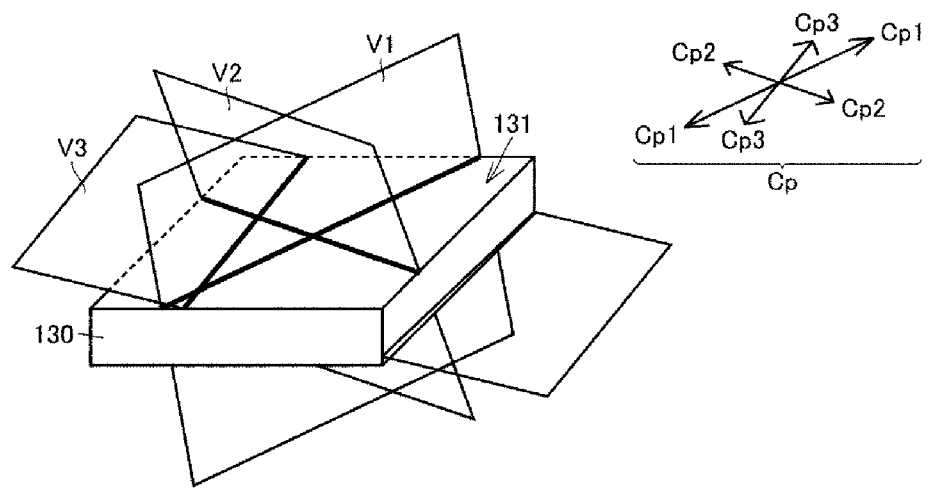
FIG. 7 is a diagram schematically illustrating the first to third virtual planes obtained by extending each of the first to third cleavage planes among the plurality of cleavage planes that can occur in the single-crystal piezoelectric layer in the piezoelectric device according to Preferred Embodiment 1 of the present invention.

In the present preferred embodiment, the single-crystal piezoelectric layer 130 includes a plurality of the piezoelectric body cleavage directions Cp that are easy to be cleaved among the directions along the first surface 131. FIG. 4 is a perspective view schematically illustrating a first virtual plane obtained by extending a first cleavage plane, which is one of a plurality of cleavage planes that can occur in the single-crystal piezoelectric layer, in the piezoelectric device according to Preferred Embodiment 1 of the present invention. FIG. 5 is a perspective view schematically illustrating a second virtual plane obtained by extending a second cleavage plane, which is one of a plurality of cleavage planes that can occur in the single-crystal piezoelectric layer, in the piezoelectric device according to Preferred Embodiment 1 of the present invention. FIG. 6 is a perspective view schematically illustrating a third virtual plane obtained by extending a third cleavage plane, which is one of a plurality of cleavage planes that can occur in the single-crystal piezoelectric layer, in the piezoelectric device according to Preferred Embodiment 1 of the present invention. FIG. 7 is a diagram schematically illustrating the first to third virtual planes obtained by extending each of the first to third cleavage planes among the plurality of cleavage planes that can occur in the single-crystal piezoelectric layer in the piezoelectric device according to Preferred Embodiment 1 of the present invention. FIG. 4 to FIG. 7 schematically illustrate the single-crystal piezoelectric layer 130 of the piezoelectric device 100.

As illustrated in FIG. 4 to FIG. 7, the single-crystal piezoelectric layer 130 includes the plurality of piezoelectric body cleavage directions Cp different from each other. To be specific, in the present preferred embodiment, since the single-crystal piezoelectric layer 130 is made of lithium tantalate or lithium niobate, for example, a first piezoelectric body cleavage direction Cp1, a second piezoelectric body cleavage direction Cp2, and a third piezoelectric body cleavage direction Cp3 are provided as three piezoelectric body cleavage directions Cp different from each other. Note that the single-crystal piezoelectric layer 130 may include two piezoelectric body cleavage directions Cp different from each other.

Further, the first piezoelectric body cleavage direction Cp1, the second piezoelectric body cleavage direction Cp2, and the third piezoelectric body cleavage direction Cp3 in the present preferred embodiment will be described. As illustrated in FIG. 4, in the present preferred embodiment, a first angle D1 is defined as an angle between the first surface 131 and a first virtual plane V1 obtained by extending a cleavage plane defining the first piezoelectric body cleavage direction Cp1. As illustrated in FIG. 5, in the present preferred embodiment, a second angle D2 is defined as an angle between the first surface 131 and a second virtual plane V2 obtained by extending a cleavage plane defining the second piezoelectric body cleavage direction Cp2. As illustrated in FIG. 6, in the present preferred embodiment, a third angle D3 is defined as an angle between the first surface 131 and a third virtual plane V3 obtained by extending a cleavage plane defining the third piezoelectric body cleavage direction Cp3.

In the single-crystal piezoelectric layer 130, since the angle between the first surface 131 and the virtual plane obtained by extending the cleavage plane defining the piezoelectric body cleavage direction Cp is larger, cleavage by the above-described cleavage plane is more likely to occur. As illustrated in FIG. 4 to FIG. 7, in the present preferred embodiment, the first angle D1 is equal to or larger than the second angle D2. The second angle D2 is greater than the third angle D3. That is, in the present preferred embodiment, in the case where the first angle D1 and the second angle D2 are equal or substantially equal to each other, cleavage is most likely to occur in both the cleavage plane defining the first piezoelectric body cleavage direction Cp1 and the cleavage plane defining the second piezoelectric body cleavage direction Cp2. In the case where the first angle D1 is larger than the second angle D2, cleavage is most likely to occur in the first piezoelectric body cleavage direction Cp1. In the single-crystal piezoelectric layer 130, cleavage is most unlikely to occur in the third piezoelectric body cleavage direction Cp3 among the three piezoelectric body cleavage directions Cp.

As illustrated in FIG. 2, the upper electrode layer 140 is arranged on the first surface 131 of the single-crystal piezoelectric layer 130. The upper electrode layer 140 is arranged so that a portion of the upper electrode layer 140 is included in the membrane portion 120.

In the present preferred embodiment, the upper electrode layer 140 and the single-crystal piezoelectric layer 130 are directly connected to each other. Note that a close contact layer made of, for example, Ti, NiCr, or the like may be arranged between the upper electrode layer 140 and the single-crystal piezoelectric layer 130. A piezoelectric device in which the close contact layer is arranged will be described later.

A portion in the upper electrode layer 140, which is in contact with the single-crystal piezoelectric layer 130, is an epitaxial growth film provided on the single-crystal piezoelectric layer 130. In the present preferred embodiment, since no close contact layer is provided between the upper electrode layer 140 and the single-crystal piezoelectric layer 130, the entire upper electrode layer 140 is an epitaxial growth film provided on the single-crystal piezoelectric layer 130.

As illustrated in FIG. 1 and FIG. 2, the upper electrode layer 140 includes an upper electrode 141, an upper pad electrode 142, and an upper connection wiring 143. When viewed in the vertical direction, the upper electrode 141 and the upper pad electrode 142 are separated from each other. The upper electrode 141 and the upper pad electrode 142 are connected to each other with the upper connection wiring 143 interposed therebetween.

The upper electrode 141 is positioned above the cavity 113 and is included in the membrane portion 120. In the present preferred embodiment, the upper electrode 141 has a circular or substantially circular outer shape when viewed in the vertical direction. Note that the outer shape of the upper electrode 141 is not limited to a circular or substantially circular shape. A piezoelectric device according to a modification including the upper electrode 141 having an outer shape different from the circular or substantially circular shape will be described later.

The upper pad electrode 142 is positioned above the base portion 110 and is not included in the membrane portion 120. In the present preferred embodiment, the upper pad electrode 142 has a circular or substantially circular outer shape when viewed in the vertical direction. Note that the outer shape of the upper pad electrode 142 is not limited to a circular or substantially circular shape.

A portion of the upper connection wiring 143 on the upper electrode 141 side is positioned above the cavity 113 and is included in the membrane portion 120. A portion of the upper connection wiring 143 on the upper pad electrode 142 side is positioned above the base portion 110 and is not included in the membrane portion 120. In the present preferred embodiment, the upper connection wiring 143 has an elliptical or substantially elliptical outer shape when viewed in the vertical direction. The upper connection wiring 143 is connected to each of the upper electrode 141 and the upper pad electrode 142 at both ends in a long axis direction when viewed in the vertical direction.

In this manner, of an upper electrode outer edge 140E that is an outer edge of the upper electrode layer 140 as viewed in the vertical direction, the upper electrode outer edge 140E included in the membrane portion 120 includes a plurality of electrode curved portions 140C extending in a curved-line shape when viewed in the vertical direction. To be specific, in the upper electrode outer edge 140E, the outer edge of each of the upper electrode 141 and a portion of the upper connection wiring 143 includes the plurality of electrode curved portions 140C. In the present preferred embodiment, the entire upper electrode outer edge 140E is provided only by the plurality of electrode curved portions 140C.

As illustrated in FIG. 2, the lower electrode layer 150 is provided on the second surface 132 of the single-crystal piezoelectric layer 130 so as to face at least a portion of the upper electrode layer 140 sandwiching the single-crystal piezoelectric layer 130 in between. The lower electrode layer 150 is arranged so that a portion of the lower electrode layer 150 is included in the membrane portion 120. In addition, in the membrane portion 120, the lower electrode layer 150 is arranged so as to face at least a portion of the upper electrode layer 140 sandwiching the single-crystal piezoelectric layer 130 in between.

A portion of the lower electrode layer 150 is positioned below the through-hole 133 provided in the single-crystal piezoelectric layer 130. A lead-out wiring may be provided inside the through-hole 133 so as to be connected to the lower electrode layer 150. When viewed in the vertical direction, an outer edge of the lead-out wiring may have a curved portion.

In the present preferred embodiment, the lower electrode layer 150 and the single-crystal piezoelectric layer 130 are directly connected to each other. Note that a close contact layer made of Ti, NiCr, or the like may be provided between the lower electrode layer 150 and the single-crystal piezoelectric layer 130. The piezoelectric device in which the close contact layer is provided will be described later.

A portion in the lower electrode layer 150, which is in contact with the single-crystal piezoelectric layer 130, is an epitaxial growth film provided on the single-crystal piezoelectric layer 130. In the present preferred embodiment, since no close contact layer is provided between the lower electrode layer 150 and the single-crystal piezoelectric layer, the entire lower electrode layer 150 is an epitaxial growth film provided on the single-crystal piezoelectric layer 130.

As illustrated in FIG. 1 and FIG. 2, the lower electrode layer 150 includes a lower electrode 151, a lower pad electrode 152, and a lower connection wiring 153. When viewed in the vertical direction, the lower electrode 151 and the lower pad electrode 152 are separated from each other. The lower electrode 151 and the lower pad electrode 152 are connected to each other with the lower connection wiring 153 interposed therebetween.

The lower electrode 151 is positioned above the cavity 113 and is included in the membrane portion 120. In the present preferred embodiment, the lower electrode 151 has a circular or substantially circular outer shape when viewed in the vertical direction. In the present preferred embodiment, an outer edge of the lower electrode 151 overlaps the outer edge of the upper electrode 141 when viewed in the vertical direction. Note that the outer shape of the lower electrode 151 is not limited to a circular or substantially circular shape. A piezoelectric device according to a modification including the lower electrode 151 having the outer shape different from the circular or substantially circular shape will be described later. In addition, the outer shape of the lower electrode 151 may be different from the outer shape of the upper electrode 141.

The lower pad electrode 152 is positioned above the base portion 110 and below the through-hole 133, and is not included in the membrane portion 120. In the present preferred embodiment, the lower pad electrode 152 has a circular or substantially circular outer shape when viewed in the vertical direction. Note that the outer shape of the lower pad electrode 152 is not limited to a circular or substantially circular shape.

A portion of the lower connection wiring 153 on the lower electrode 151 side is positioned above the cavity 113 and is included in the membrane portion 120. A portion of the lower connection wiring 153 on the lower pad electrode 152 side is positioned above the base portion 110 and is not included in the membrane portion 120. In the present preferred embodiment, the lower connection wiring 153 has an outer shape of an elliptical or substantially elliptical shape when viewed in the vertical direction. The lower connection wiring 153 is connected to each of the lower electrode 151 and the lower pad electrode 152 at both ends in a long axis direction when viewed in the vertical direction.

In this manner, of a lower electrode outer edge 150E that is an outer edge of the lower electrode layer 150 as viewed in the vertical direction, the lower electrode outer edge 150E included in the membrane portion 120 includes a plurality of electrode curved portions 150C. To be specific, in the lower electrode outer edge 150E, the outer edge of each of the lower electrode 151 and a portion of the lower connection wiring 153 includes the plurality of electrode curved portions 150C. In the present preferred embodiment, the entire or substantially the entire lower electrode outer edge 150E includes a plurality of electrode curved portions.

In the present preferred embodiment, since the occurrence of cracking due to cleavage of the single-crystal piezoelectric layer 130 is reduced or prevented as described later, a film thickness of each of the upper electrode layer 140 and the lower electrode layer 150 can be appropriately set.

Additionally, in the present preferred embodiment, each of the upper electrode layer 140 and the lower electrode layer 150 is made of, for example, Al or Pt. In the present preferred embodiment, as will be described later, the occurrence of cracking due to cleavage of the single-crystal piezoelectric layer 130 is reduced or prevented. Therefore, for example, each of the upper electrode layer 140 and the lower electrode layer 150 may be made of Au from the viewpoint of heat resistance, an Al alloy from the viewpoint of electric power handling capability, or Cr or NiCr from the viewpoint of a close contact property.

As illustrated in FIG. 2, the second single-crystal silicon layer 160 is positioned below the lower electrode layer 150. The second single-crystal silicon layer 160 includes a fourth surface 161 facing upward. In the present preferred embodiment, the second single-crystal silicon layer 160 is laminated on the upper surface of the base portion 110 so as to cover the upper side of the cavity 113, that is, in the present preferred embodiment, a lower surface of the second single-crystal silicon layer 160 positioned on the side opposite to the fourth surface 161 is exposed in the cavity 113.

As illustrated in FIG. 1 and FIG. 2, the second single-crystal silicon layer 160 includes a plurality of second silicon cleavage directions Cs, which are easy to be cleaved, among directions along the fourth surface 161. Each of the plurality of second silicon cleavage directions Cs is defined as a direction extending along a boundary line between a cleavage plane occurring when the second single-crystal silicon layer 160 is cleaved and the fourth surface 161. Specifically, the second single-crystal silicon layer 160 includes two second silicon cleavage directions Cs. The two second silicon cleavage directions Cs described above are orthogonal or substantially orthogonal to each other.

In the present preferred embodiment, when viewed in the vertical direction, at least a portion of the upper electrode outer edge 140E and at least a portion of the lower electrode outer edge 150E are non-parallel to each of the plurality of second silicon cleavage directions Cs. Specifically, the entire or substantially the entire circumference of the upper electrode outer edge 140E and the entire or substantially the entire circumference of the lower electrode outer edge 150E are non-parallel to each of the plurality of second silicon cleavage directions Cs. In the present preferred embodiment, at least one direction of the plurality of piezoelectric body cleavage directions Cp is non-parallel to each of the plurality of second silicon cleavage directions Cs. More specifically, each of the plurality of piezoelectric body cleavage directions Cp is non-parallel to each of the plurality of second silicon cleavage directions Cs. In addition, when viewed in the vertical direction, an angle between each of the plurality of second silicon cleavage directions Cs and at least one of the plurality of piezoelectric body cleavage directions Cp is preferably equal to or more than about 30 degrees and equal to or less than about 60 degrees, for example. In the present preferred embodiment, at least the angle between the first piezoelectric body cleavage direction Cp1 defining the cleavage plane most easily cleaved in the single-crystal piezoelectric layer 130 and each of the plurality of second silicon cleavage directions Cs is equal to or more than 30 degrees and equal to or less than 60 degrees, for example.

As described above, in the present preferred embodiment, at least one of the base portion 110 and the membrane portion 120 includes a single-crystal silicon layer. The single-crystal silicon layer includes an upper surface facing upward. In the present preferred embodiment, the single-crystal silicon layer is the second single-crystal silicon layer 160, and the above-described upper surface is the fourth surface 161. The single-crystal silicon layer includes the plurality of silicon cleavage directions Cs defined as a direction extending along a boundary line between a cleavage plane occurring when the single-crystal silicon layer is cleaved and the upper surface. At least one direction of the plurality of piezoelectric body cleavage directions Cp is non-parallel to each of the plurality of silicon cleavage directions Cs. Specifically, all of the plurality of piezoelectric body cleavage directions Cp are non-parallel to each of the plurality of silicon cleavage directions Cs. In addition, when viewed in the vertical direction, the angle between each of the plurality of silicon cleavage directions Cs and at least one of the plurality of piezoelectric body cleavage directions Cp is preferably equal to or more than about 30 degrees and equal to or less than about 60 degrees, for example. In the present preferred embodiment, at least the angle between the first piezoelectric body cleavage direction Cp1 defining the cleavage plane most easily cleaved in the single-crystal piezoelectric layer 130 and each of the plurality of silicon cleavage directions Cs is equal to or more than about 30 degrees and equal to or less than about 60 degrees, for example.

In the present preferred embodiment, when viewed in the vertical direction, at least a portion of the outer edge 120E of the membrane portion 120 is non-parallel to each of the second silicon cleavage directions Cs. To be more specific, when viewed in the vertical direction, the entire or substantially the entire circumference of the outer edge 120E of the membrane portion 120 is non-parallel to each of the second silicon cleavage directions Cs. To be further more specific, when viewed in the vertical direction, each of the plurality of membrane straight portions 120S is non-parallel to the second silicon cleavage direction Cs.

In the above-described preferred embodiment, the above-described plurality of layers further includes an intermediate layer 170. In the present preferred embodiment, the intermediate layer 170 is provided so as to be in contact with each of a lower surface of the lower electrode layer 150 and a portion of a lower surface of the single-crystal piezoelectric layer 130, the portion not being covered with the lower electrode layer 150. In addition, in the present preferred embodiment, the intermediate layer 170 is provided so as to be in contact with an upper surface of the second single-crystal silicon layer 160. Thus, in the present preferred embodiment, the lower electrode layer 150 is covered with the second single-crystal silicon layer 160. Therefore, the single-crystal piezoelectric layer 130 receives a relatively large residual stress from the lower electrode layer 150.

Note that the intermediate layer 170 and the second single-crystal silicon layer 160 are not necessarily directly connected to each other, and the intermediate layer 170 and the second single-crystal silicon layer 160 may be connected to each other with a metal layer interposed therebetween. In addition, the plurality of layers described above may not include the intermediate layer 170.

As described above, in the present preferred embodiment, the membrane portion 120 includes the single-crystal piezoelectric layer 130, the upper electrode layer 140, the lower electrode layer 150, the second single-crystal silicon layer 160, and the intermediate layer 170.

In the present preferred embodiment, the single-crystal piezoelectric layer 130 can be distorted by applying a potential difference between the upper electrode 141 and the lower electrode 151. The piezoelectric device 100 is used as, for example, a piezoelectric micromachined ultrasonic transducer (PMUT) that uses bending vibration.

Hereinafter, a non-limiting example of a method for manufacturing the piezoelectric device according to Preferred Embodiment 1 of the present invention will be described.

Figure 8:
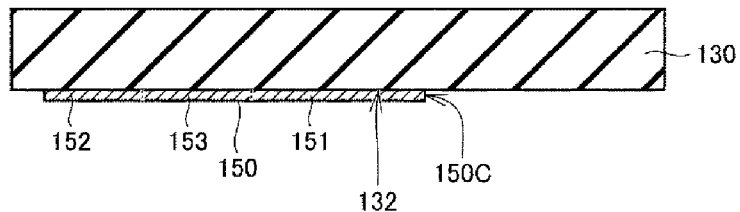
FIG. 8 is a cross-sectional view illustrating a state in which a lower electrode layer is provided on a lower surface of the single-crystal piezoelectric layer in a method for manufacturing the piezoelectric device according to Preferred Embodiment 1 of the present invention.

FIG. 8 is a cross-sectional view illustrating a state in which a lower electrode layer is provided on the lower surface of the single-crystal piezoelectric layer in the method for manufacturing the piezoelectric device according to Preferred Embodiment 1 of the present invention. As illustrated in FIG. 8, the lower electrode layer 150 is provided on the lower surface of the single-crystal piezoelectric layer 130 by, for example, a lift-off method, a plating method, an etching method, or the like. In the present preferred embodiment, the outer shape of the lower electrode layer 150 as viewed in the vertical direction is patterned into a desired shape using a photolithography technique, for example.

In the present preferred embodiment, when the lower electrode layer 150 is provided, a single-crystal piezoelectric substrate in a wafer state is used as the single-crystal piezoelectric layer. In the present preferred embodiment, for example, a single-crystal piezoelectric substrate in a wafer state in which an orientation flat surface of the single-crystal piezoelectric substrate is formed is used. The above-described orientation flat surface is formed, for example, so that an angle between the orientation flat surface and at least one of the three piezoelectric body cleavage directions Cp illustrated in FIG. 1 is, for example, equal to or more than about 30 degrees and equal to or less than about 60 degrees with respect to the three piezoelectric body cleavage directions Cp in the single-crystal piezoelectric substrate. Alternatively, the above-described orientation flat surface may be formed, for example, so that the orientation flat surface is positioned orthogonal, substantially orthogonal, parallel, or substantially parallel to at least one of the three piezoelectric body cleavage directions Cp illustrated in FIG. 1 with respect to the three piezoelectric body cleavage directions Cp in the single-crystal piezoelectric substrate.

Figure 9:
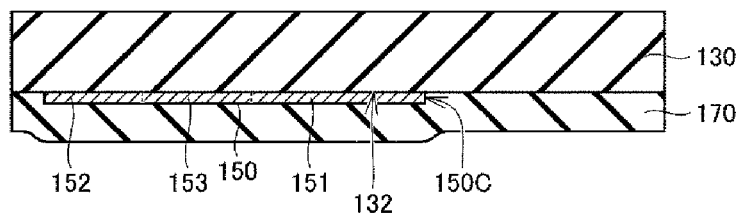
FIG. 9 is a cross-sectional view illustrating a state in which an intermediate layer is provided on a lower surface of each of the lower electrode layer and the single-crystal piezoelectric layer in the method for manufacturing the piezoelectric device according to Preferred Embodiment 1 of the present invention.

FIG. 9 is a cross-sectional view illustrating a state in which an intermediate layer is provided on the lower surface of each of the lower electrode layer and the single-crystal piezoelectric layer in the method for manufacturing the piezoelectric device according to Preferred Embodiment 1 of the present invention. As illustrated in FIG. 9, the intermediate layer 170 is provided on the lower surface of each of the lower electrode layer 150 and the single-crystal piezoelectric layer 130 by, for example, a chemical vapor deposition (CVD) method, a physical vapor deposition (PVD) method, or the like.

Figure 10:
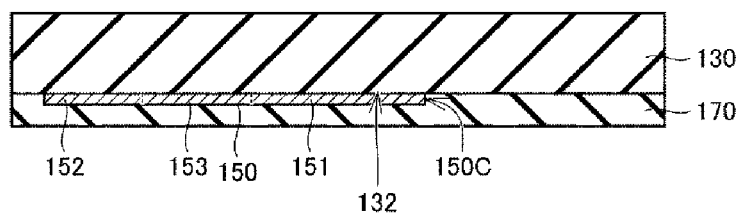
FIG. 10 is a cross-sectional view illustrating a state in which a lower surface of the intermediate layer is flattened in the method for manufacturing the piezoelectric device according to Preferred Embodiment 1 of the present invention.

FIG. 10 is a cross-sectional view illustrating a state in which the lower surface of the intermediate layer is flattened in the method for manufacturing the piezoelectric device according to Preferred Embodiment 1 of the present invention. As illustrated in FIG. 10, the lower surface of the intermediate layer 170 is flattened by, for example, chemical mechanical polishing (CMP) or the like.

Figure 11:
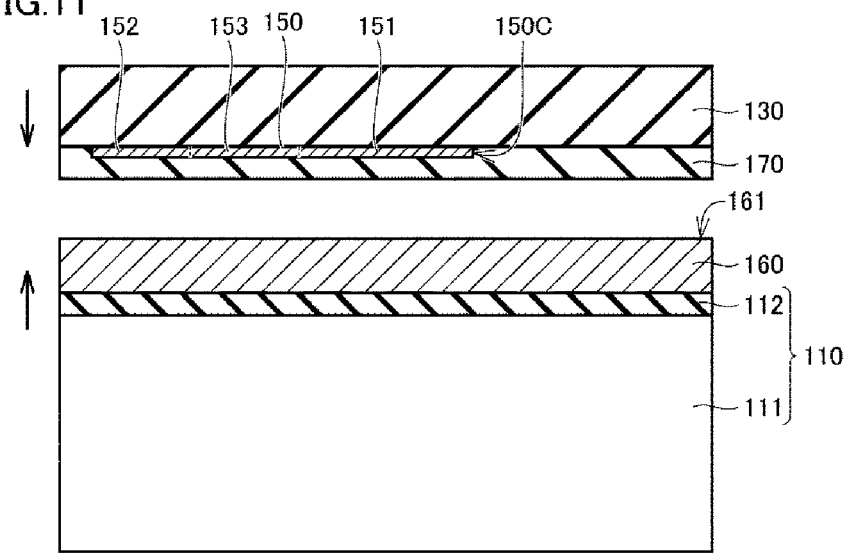
FIG. 11 is a cross-sectional view illustrating a state in which a multilayer body is bonded to a plurality of layers illustrated in FIG. 10 in the method for manufacturing the piezoelectric device according to Preferred Embodiment 1 of the present invention.
Figure 12:
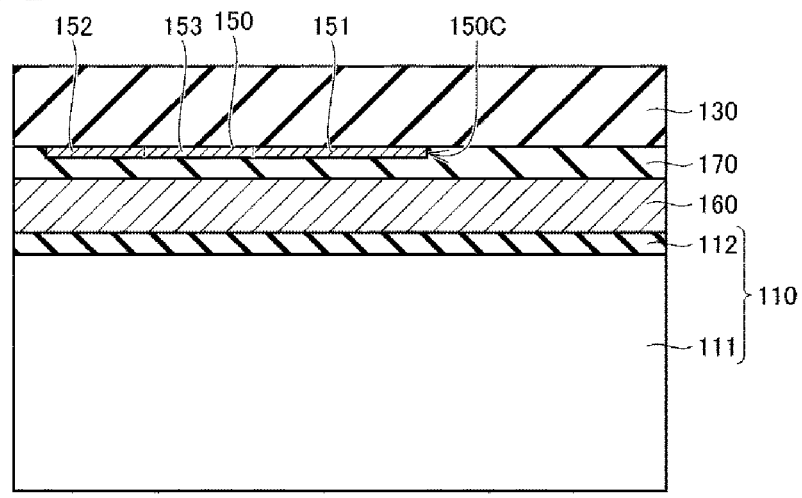
FIG. 12 is a cross-sectional view illustrating a state in which the multilayer body is bonded to the lower surface of the intermediate layer in the method for manufacturing the piezoelectric device according to Preferred Embodiment 1 of the present invention.

FIG. 11 is a cross-sectional view illustrating a state in which a multilayer body is bonded to the plurality of layers illustrated in FIG. 10 in the method for manufacturing the piezoelectric device according to Preferred Embodiment 1 of the present invention. FIG. 12 is a cross-sectional view illustrating a state in which the multilayer body is bonded to the lower surface of the intermediate layer in the method for manufacturing the piezoelectric device according to Preferred Embodiment 1 of the present invention. As illustrated in FIG. 11 and FIG. 12, the multilayer body is bonded to the plurality of layers illustrated in FIG. 10. The multilayer body includes the base portion 110 in which the cavity 113 is not formed and the second single-crystal silicon layer 160 bonded to the upper surface of the base portion 110. In the present preferred embodiment, the above-described multilayer body is, for example, a silicon on insulator (SOI) substrate.

In the present preferred embodiment, an SOI substrate having an orientation flat surface is used as the SOI substrate. The above-described orientation flat surface is formed corresponding to two second silicon cleavage directions Cs of the second single-crystal silicon layer 160 in the SOI substrate. For example, the orientation flat surface is formed on the SOI substrate so that the orientation flat surface of the SOI substrate and one of the two second silicon cleavage directions Cs illustrated in FIG. 1 are parallel or substantially parallel to each other and the orientation flat surface of the SOI substrate and the other one of the two second silicon cleavage directions Cs are orthogonal or substantially orthogonal to each other.

In the case where the orientation flat surface is formed on the single-crystal piezoelectric substrate so that the angle between at least one of the three piezoelectric body cleavage directions Cp in the single-crystal piezoelectric substrate and the orientation flat surface of the single-crystal piezoelectric substrate is, for example, equal to or more than about 30 degrees and equal to or less than about 60 degrees, when the SOI substrate is bonded to the plurality of layers, the bonding is performed so that the orientation flat surface of the SOI substrate and the orientation flat surface of the single-crystal piezoelectric substrate overlap each other in the vertical direction. Thus, each of the plurality of piezoelectric body cleavage directions Cp is non-parallel to each of the plurality of second silicon cleavage directions Cs. Further, an angle between each of the plurality of second silicon cleavage directions Cs and at least one of the plurality of piezoelectric body cleavage directions Cp is, for example, equal to or more than about 30 degrees and equal to or less than about 60 degrees.

Note that in the single-crystal piezoelectric substrate, in the case where the orientation flat surface is formed on the single-crystal piezoelectric substrate so that at least one of the three piezoelectric body cleavage directions Cp and the orientation flat surface of the single-crystal piezoelectric substrate are positioned orthogonal, substantially orthogonal, parallel or substantially parallel to each other, when the SOI substrate is bonded to the above-described plurality of layers, the bonding is performed so that the orientation flat surface of the SOI substrate and the orientation flat surface of the single-crystal piezoelectric substrate do not overlap each other in the vertical direction. Thus, each of the plurality of piezoelectric body cleavage directions Cp is non-parallel to each of the plurality of second silicon cleavage directions Cs.

Figure 13:
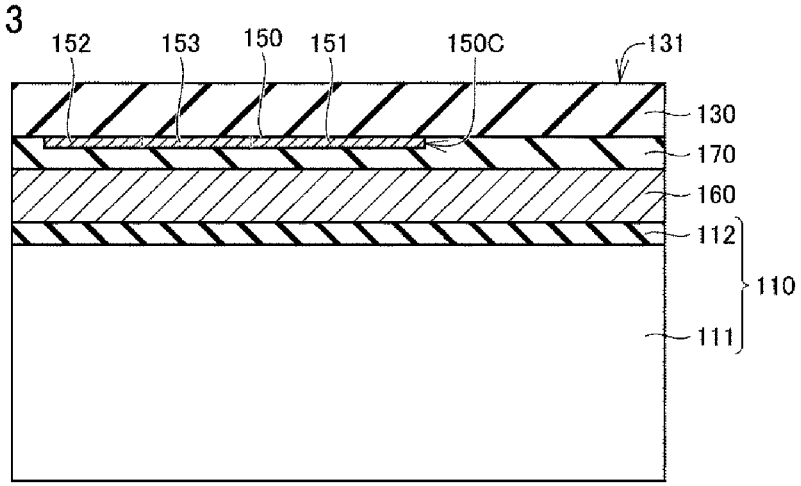
FIG. 13 is a cross-sectional view illustrating a state in which an upper surface of the single-crystal piezoelectric layer is polished in the method for manufacturing the piezoelectric device according to Preferred Embodiment 1 of the present invention.

FIG. 13 is a cross-sectional view illustrating a state in which an upper surface of the single-crystal piezoelectric layer is polished in the method for manufacturing the piezoelectric device according to Preferred Embodiment 1 of the present invention. As illustrated in FIG. 13, an upper surface of the single-crystal piezoelectric layer 130 is polished by, for example, CMP or the like so that the single-crystal piezoelectric layer 130 has a desired thickness. In this case, the thickness of the single-crystal piezoelectric layer 130 is adjusted so as to obtain a desired amount of expansion and contraction of the single-crystal piezoelectric layer 130 due to application of voltage.

Note that a separation layer may be formed on the upper surface side of the single-crystal piezoelectric layer 130 by, for example, ion implantation in advance. In this case, the thickness of the single-crystal piezoelectric layer 130 can be easily adjusted by separating the separation layer before the upper surface of the single-crystal piezoelectric layer 130 is polished by CMP or the like. Alternatively, the thickness may be adjusted by simply separating a separation layer without polishing the upper surface of the single-crystal piezoelectric layer 130 by CMP or the like.

Figure 14:
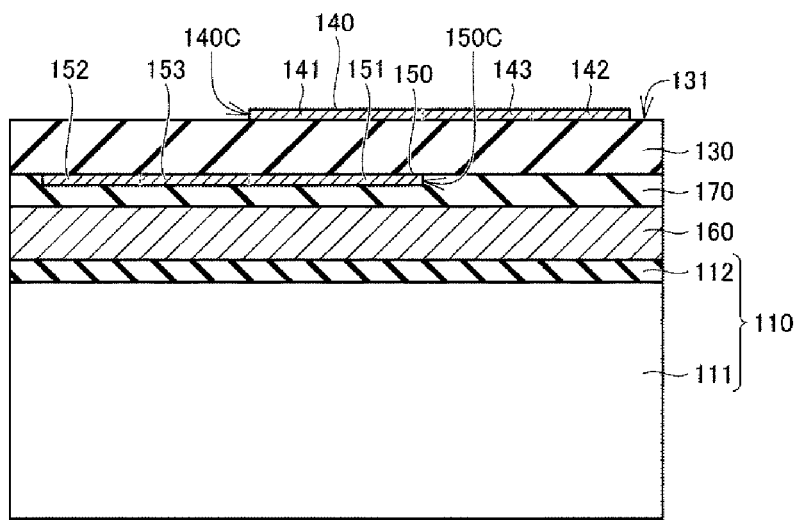
FIG. 14 is a cross-sectional view illustrating a state in which an upper electrode layer is provided on an upper surface of the single-crystal piezoelectric layer in the method for manufacturing the piezoelectric device according to Preferred Embodiment 1 of the present invention.

FIG. 14 is a cross-sectional view illustrating a state in which an upper electrode layer is provided on the upper surface of the single-crystal piezoelectric layer in the method for manufacturing the piezoelectric device according to Preferred Embodiment 1 of the present invention. As illustrated in FIG. 14, the upper electrode layer 140 is provided on the first surface 131, which is the upper surface of the single-crystal piezoelectric layer 130, by, for example, a lift-off method, a plating method, an etching method, or the like. In the present preferred embodiment, the outer shape of the upper electrode layer 140 as viewed in the vertical direction is patterned into a desired shape using, for example, photolithography technique.

Figure 15:
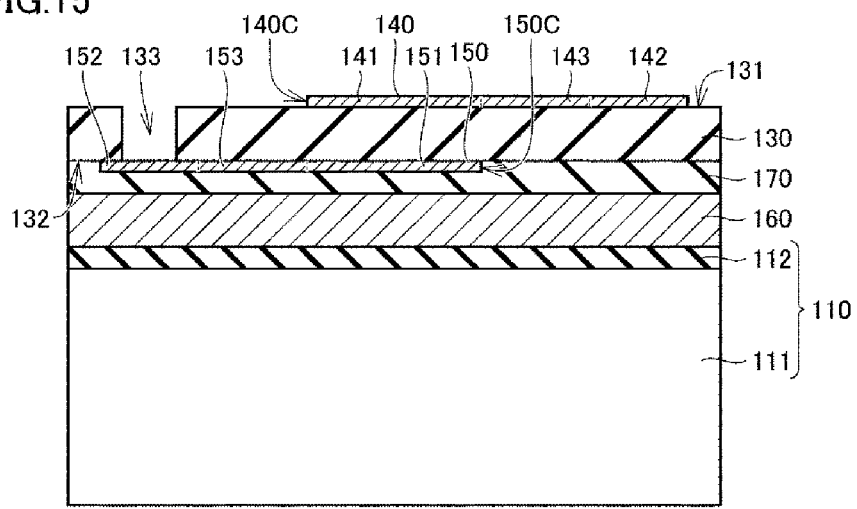
FIG. 15 is a cross-sectional view illustrating a state in which a through-hole is formed in the single-crystal piezoelectric layer in the method for manufacturing the piezoelectric device according to Preferred Embodiment 1 of the present invention.

FIG. 15 is a cross-sectional view illustrating a state in which a through-hole is formed in the single-crystal piezoelectric layer in the method for manufacturing a piezoelectric device according to Preferred Embodiment 1 of the present invention. As illustrated in FIG. 15, a through-hole 133 is formed by etching a portion of the single-crystal piezoelectric layer 130.

Finally, the cavity 113 is formed in the base portion 110 by, for example, deep reactive ion etching (Deep RIE) or the like with respect to the base portion 110 from the lower surface side of the base portion 110. Thus, the membrane portion 120 illustrated in FIG. 2 is formed, and the piezoelectric device 100 according to Preferred Embodiment 1 of the present invention as illustrated in FIG. 2 is manufactured. Note that the cavity 113 may be formed so that an upper end of the cavity 113 is formed of the box layer 112. In this case, the membrane portion 120 includes the box layer 112.

Hereinafter, a piezoelectric device according to modifications of Preferred Embodiment 1 of the present invention will be described. In the piezoelectric device 100 according to Preferred Embodiment 1 of the present invention, when viewed in the vertical direction, the outer shapes of the upper electrode layer 140 and the lower electrode layer 150 are not limited to the shapes described above. In the piezoelectric device according to each modification of Preferred Embodiment 1 of the present invention described below, the outer shapes of the upper electrode and the lower electrode as viewed in the vertical direction are different from the outer shapes of the upper electrode 141 and the lower electrode 151 in the piezoelectric device 100 according to Preferred Embodiment 1 of the present invention, respectively. Note that in each of the following modifications, the outer shape of the lower electrode is the same or substantially the same as the outer shape of the upper electrode.

Figure 16:
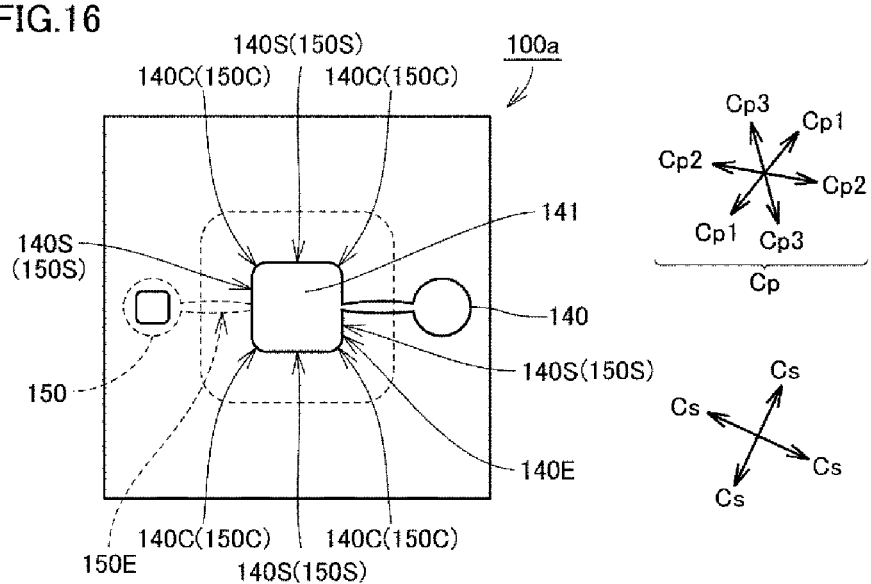
FIG. 16 is a plan view of a piezoelectric device according to a first modification of Preferred Embodiment 1 of the present invention.

FIG. 16 is a plan view of a piezoelectric device according to a first modification of Preferred Embodiment 1 of the present invention. As illustrated in FIG. 16, in the piezoelectric device 100a according to the first modification of Preferred Embodiment 1 of the present invention, the upper electrode 141 has a rectangular or substantially rectangular outer shape when viewed in the vertical direction. Specifically, the upper electrode 141 has, for example, a square or substantially square outer shape when viewed in the vertical direction. When viewed in the vertical direction, a corner portion of the outer shape of the upper electrode 141 is rounded. In the present modification, in the upper electrode layer 140, the corner portion where stress is likely to concentrate are rounded, such that residual stress in the single-crystal piezoelectric layer 130 can be reduced and the occurrence of cracking due to cleavage of the single-crystal piezoelectric layer 130 can be reduced or prevented.

Figure 17:
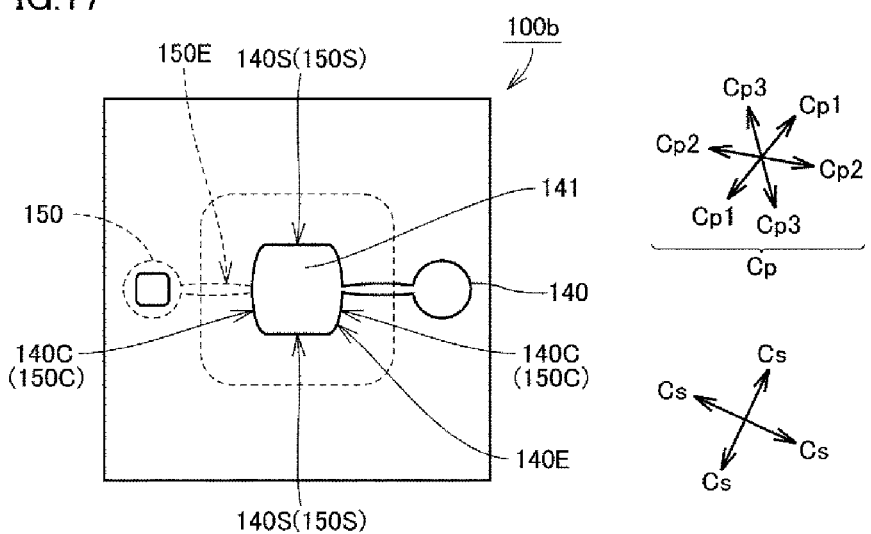
FIG. 17 is a plan view of a piezoelectric device according to a second modification of Preferred Embodiment 1 of the present invention.

FIG. 17 is a plan view of a piezoelectric device according to a second modification of Preferred Embodiment 1 of the present invention. As illustrated in FIG. 17, in a piezoelectric device 100b according to the second modification of Preferred Embodiment 1 of the present invention, the upper electrode 141 has a rectangular or substantially rectangular outer shape. Specifically, it has a substantially square outer shape when viewed in the vertical direction. The upper electrode 141 has a rectangular or substantially square outer shape when viewed in the vertical direction. In the present modification, each of two sides of the upper electrode 141 facing each other is curved in a convex shape toward an outer side portion.

Figure 18:
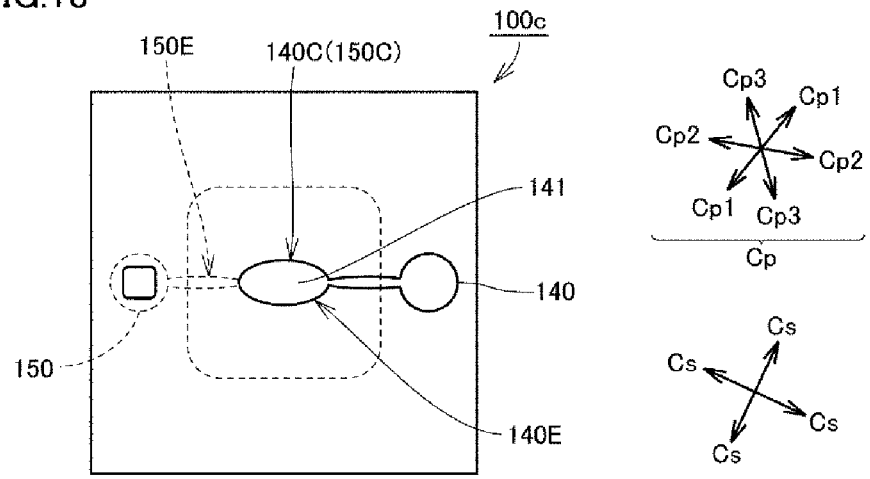
FIG. 18 is a plan view of a piezoelectric device according to a third modification of Preferred Embodiment 1 of the present invention.

FIG. 18 is a plan view of a piezoelectric device according to a third modification of Preferred Embodiment 1 of the present invention. As illustrated in FIG. 18, in a piezoelectric device 100c according to the third modification of Preferred Embodiment 1 of the present invention, the upper electrode 141 has an elliptical or substantially elliptical outer shape when viewed in the vertical direction.

Figure 19:
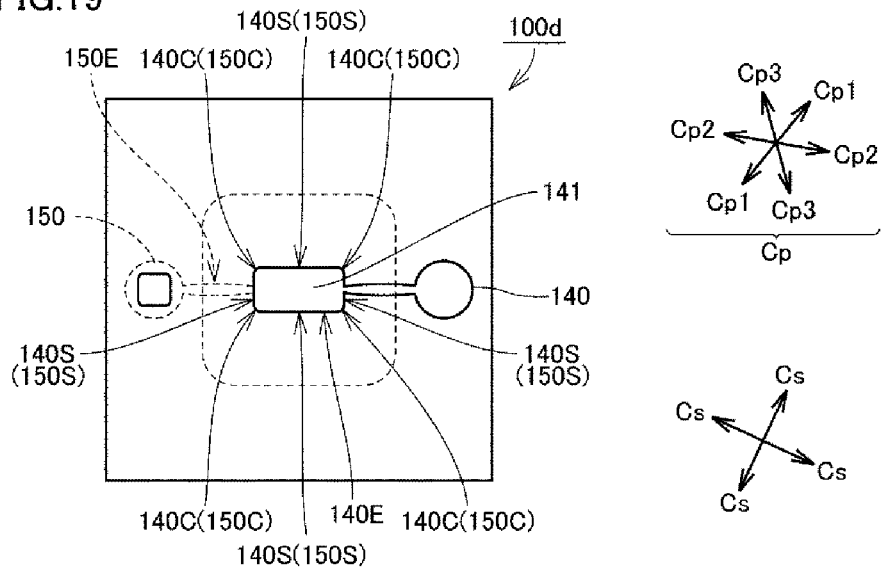
FIG. 19 is a plan view of a piezoelectric device according to a fourth modification of Preferred Embodiment 1 of the present invention.

FIG. 19 is a plan view of a piezoelectric device according to a fourth modification of Preferred Embodiment 1 of the present invention. As illustrated in FIG. 19, in a piezoelectric device 100d according to the fourth modification of Preferred Embodiment 1 of the present invention, the upper electrode 141 has a rectangular or substantially rectangular outer shape when viewed in the vertical direction. Specifically, the upper electrode 141 has, for example, a rectangular or substantially rectangular parallelepiped outer shape when viewed in the vertical direction. When viewed in the vertical direction, a corner portion of the outer shape of the upper electrode 141 is rounded.

Figure 20:
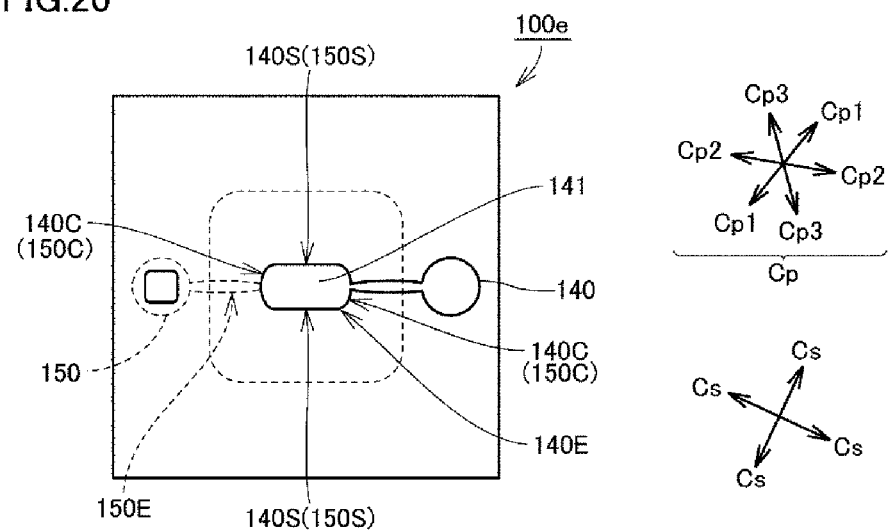
FIG. 20 is a plan view of a piezoelectric device according to a fifth modification of Preferred Embodiment 1 of the present invention.

FIG. 20 is a plan view of a piezoelectric device according to a fifth modification of Preferred Embodiment 1 of the present invention. As illustrated in FIG. 20, in a piezoelectric device 100e according to the fifth modification of Preferred Embodiment 1 of the present invention, the upper electrode 141 has a rectangular or substantially rectangular outer shape when viewed in the vertical direction. Specifically, the upper electrode 141 has, for example, a rectangular or substantially rectangular parallelepiped outer shape when viewed in the vertical direction. In the present modification, two short sides of the upper electrode 141 facing each other are curved in a convex shape toward an outer side portion.

Figure 21:
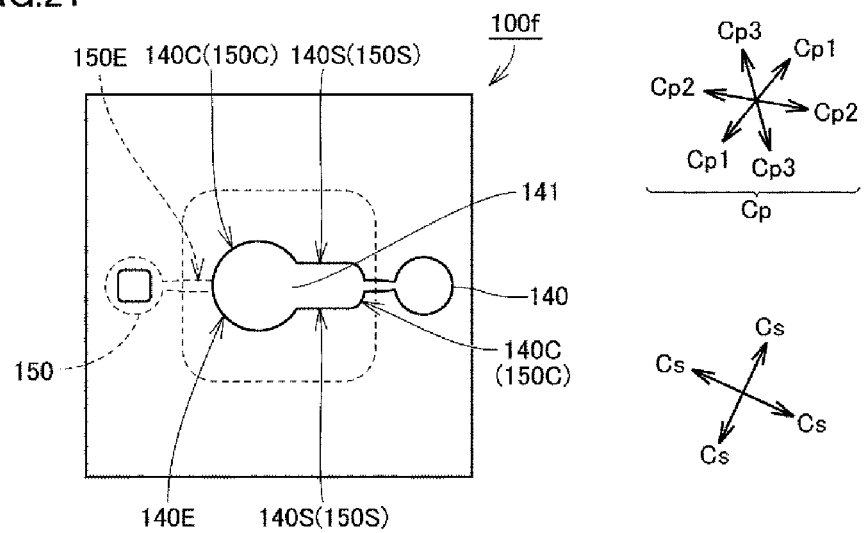
FIG. 21 is a plan view of a piezoelectric device according to a sixth modification of Preferred Embodiment 1 of the present invention.

FIG. 21 is a plan view of a piezoelectric device according to a sixth modification of Preferred Embodiment 1 of the present invention. As illustrated in FIG. 21, in a piezoelectric device 100f according to the sixth modification of Preferred Embodiment 1 of the present invention, the upper electrode 141 has an outer shape in which a second portion extends from a circular or substantially circular first portion when viewed in the vertical direction. The second portion has a rectangular or substantially rectangular outer shape, and a side positioned on the side opposite to the first portion side is curved in a convex shape toward an outer side portion.

As illustrated in FIG. 16, FIG. 17, and FIG. 19 to FIG. 21, in the first modification, the second modification, and the fourth modification to the sixth modification of Preferred Embodiment 1 of the present invention, the upper electrode outer edge 140E and the lower electrode outer edge 150E in the membrane portion 120 respectively include a plurality of electrode curved portions 140C and 150C extending in a curved-line shape when viewed in the vertical direction and a plurality of electrode straight portions 140S and 150S extending in a straight-line shape when viewed in the vertical direction.

Further, as illustrated in FIG. 16, FIG. 17, and FIG. 19 to FIG. 21, when viewed in the vertical direction, at least a portion of the plurality of electrode straight portions 140S and 150S is non-parallel to at least one direction of the plurality of piezoelectric body cleavage directions Cp. To be specific, when viewed in the vertical direction, all of the plurality of electrode straight portions 140S and 150S are non-parallel to at least one direction of the piezoelectric body cleavage direction Cp. To be more specific, when viewed in the vertical direction, all of the plurality of electrode straight portions 140S and 150S are non-parallel to each of the piezoelectric body cleavage directions Cp. When viewed in the vertical direction, each of the plurality of electrode straight portions 140S and 150S is non-parallel to each of the plurality of second silicon cleavage directions Cs.

As described above, in the piezoelectric device 100 according to Preferred Embodiment 1 of the present invention and the piezoelectric devices 100a to 100f according to each modification of Preferred Embodiment 1 of the present invention, when viewed in the vertical direction, the upper electrode outer edge 140E of the upper electrode layer 140 and the lower electrode outer edge 150E of the lower electrode layer 150 are respectively provided of the plurality of electrode curved portions 140C and 150C, or include the plurality of electrode curved portions 140C and 150C and the plurality of electrode straight portions 140S and 150S. When viewed in the vertical direction, at least a portion of the plurality of electrode straight portions 140S and 150S is non-parallel to at least one direction of the plurality of piezoelectric body cleavage directions Cp. To be specific, when viewed in the vertical direction, all of the plurality of electrode straight portions 140S and 150S are non-parallel to at least one direction of the plurality of piezoelectric body cleavage directions Cp. To be more specific, when viewed in the vertical direction, all of the plurality of electrode straight portions 140S and 150S are non-parallel to at least one direction of the plurality of piezoelectric body cleavage directions Cp. To be further more specific, when viewed in the vertical direction, all of the plurality of electrode straight portions 140S and 150S are non-parallel to each of the plurality of piezoelectric body cleavage directions Cp.

That is, in the present preferred embodiment, when viewed in the vertical direction, at least a portion of the upper electrode outer edge 140E and at least a portion of the lower electrode outer edge 150E are non-parallel to at least one direction of the plurality of piezoelectric body cleavage directions Cp. As such, cracking due to cleavage is less likely to occur along at least one direction of the plurality of piezoelectric body cleavage directions Cp, and thus it is possible to reduce or prevent the occurrence of cracking due to cleavage in the single-crystal piezoelectric layer 130.

Furthermore, in the present preferred embodiment, when viewed in the vertical direction, the entire or substantially the entire circumference of the upper electrode outer edge 140E and the entire or substantially the entire circumference of the lower electrode outer edge 150E are non-parallel to at least one direction of the plurality of piezoelectric body cleavage directions Cp. Accordingly, cracking due to cleavage is further less likely to occur along at least one direction of the plurality of piezoelectric body cleavage directions Cp, and thus the occurrence of cracking due to cleavage in the single-crystal piezoelectric layer 130 can be further reduced or prevented.

Furthermore, in the present preferred embodiment, when viewed in the vertical direction, at least a portion of the upper electrode outer edge 140E and at least a portion of the lower electrode outer edge 150E are non-parallel to any of the plurality of piezoelectric body cleavage directions Cp. As such, cracking due to cleavage is less likely to occur along each of the plurality of piezoelectric body cleavage directions Cp, and thus it is possible to reduce or prevent the occurrence of cracking due to cleavage in the single-crystal piezoelectric layer 130.

Furthermore, in the present preferred embodiment, when viewed in the vertical direction, the entire or substantially the entire circumference of the upper electrode outer edge 140E and the entire or substantially the entire circumference of the lower electrode outer edge 150E are non-parallel to any of the plurality of piezoelectric body cleavage directions Cp. Accordingly, cracking due to cleavage is further less likely to occur along each of the plurality of piezoelectric body cleavage directions Cp, and thus the occurrence of cracking due to cleavage in the single-crystal piezoelectric layer 130 can be further reduced or prevented.

Note that among the modifications of the present preferred embodiment, in the modification in which each of the upper electrode outer edge 140E and the lower electrode outer edge 150E includes the electrode straight portions 140S and 150S, when viewed in the vertical direction, it is preferable that the angles of the electrode straight portions 140S and 150S formed respectively by the first piezoelectric body cleavage direction Cp1, the second piezoelectric body cleavage direction Cp2, and the third piezoelectric body cleavage direction Cp3 increase in this order. In addition, in the case where the first angle D1 and the second angle D2 are equal or substantially equal to each other, it is preferable that both of the first piezoelectric body cleavage direction Cp1 and the second piezoelectric body cleavage direction Cp2 form larger angles with the electrode straight portions 140S and 150S than at least the third piezoelectric body cleavage direction Cp3. As such, it is possible to further reduce or prevent cracking due to cleavage along the single-crystal piezoelectric layer 130 in a direction in which cleavage is likely to occur among the plurality of piezoelectric body cleavage directions Cp.

In addition, in the piezoelectric devices 100a, 100b, and 100d to 100f according to each modification of Preferred Embodiment 1 of the present invention, at least a portion of the plurality of electrode straight portions 140S and 150S is non-parallel to each of the plurality of second silicon cleavage directions Cs when viewed in the vertical direction.

As a result, in the second single-crystal silicon layer 160 included in the membrane portion 120, it is possible to reduce or prevent the occurrence of cracking due to cleavage along the second silicon cleavage direction Cs.

In addition, in the piezoelectric devices 100a, 100b, and 100d to 100f according to each modification of Preferred Embodiment 1 of the present invention, all of the plurality of electrode straight portions 140S and 150S are non-parallel to each of the plurality of second silicon cleavage directions Cs when viewed in the vertical direction.

As a result, in the second single-crystal silicon layer 160 included in the membrane portion 120, it is possible to further suppress the occurrence of cracking due to cleavage along the second silicon cleavage direction Cs.

In addition, in each of the piezoelectric device 100 according to Preferred Embodiment 1 of the present invention and the piezoelectric devices 100a to 100f according to each modification of Preferred Embodiment 1 of the present invention, the outer edge 120E of the membrane portion 120 includes the plurality of membrane curved portions 120C or includes the plurality of membrane curved portions 120C and the plurality of membrane straight portions 120S when viewed in the vertical direction. When viewed in the vertical direction, each of the plurality of membrane straight portions 120S is non-parallel to each of the plurality of second silicon cleavage directions Cs.

That is, when viewed in the vertical direction, at least a portion of the outer edge 120E of the membrane portion 120 is non-parallel to each of the plurality of second silicon cleavage directions Cs.

As a result, in the second single-crystal silicon layer 160 included in the membrane portion 120, it is possible to reduce or prevent the occurrence of cracking due to cleavage along the second silicon cleavage direction Cs.

To be more specific, in each of the piezoelectric device 100 according to Preferred Embodiment 1 of the present invention and the piezoelectric devices 100a to 100f according to each modification of Preferred Embodiment 1 of the present invention, the entire or substantially the entire circumference of the outer edge 120E of the membrane portion 120 is non-parallel to each of the plurality of second silicon cleavage directions Cs when viewed in the vertical direction.

As a result, in the second single-crystal silicon layer 160 included in the membrane portion 120, it is possible to further reduce or prevent the occurrence of cracking due to cleavage along the second silicon cleavage direction Cs.

In addition, in each of the piezoelectric device 100 according to Preferred Embodiment 1 of the present invention and the piezoelectric devices 100a to 100f according to each modification of Preferred Embodiment 1 of the present invention, a portion of each of the upper electrode layer 140 and the lower electrode layer 150, which is in contact with the single-crystal piezoelectric layer 130, is an epitaxial growth film provided on the single-crystal piezoelectric layer 130. As such, electric power handling characteristics of the piezoelectric device 100 can be improved.

In addition, in each of the piezoelectric device 100 according to Preferred Embodiment 1 of the present invention and the piezoelectric devices 100a to 100f according to each modification of Preferred Embodiment 1 of the present invention, at least one direction of the plurality of piezoelectric body cleavage directions Cp is non-parallel to each of the plurality of silicon cleavage directions Cs.

As such, the occurrence of cracking due to cleavage in the single-crystal piezoelectric layer 130 can be reduced or prevented. In the present preferred embodiment, all of the plurality of piezoelectric body cleavage directions Cp are non-parallel to each of the plurality of silicon cleavage directions Cs.

Preferred Embodiment 2

Hereinafter, a piezoelectric device according to Preferred Embodiment 2 of the present invention will be described. The piezoelectric device according to Preferred Embodiment 2 of the present invention differs from the piezoelectric device 100 according to Preferred Embodiment 1 of the present invention mainly in the configuration of each of the membrane portion and the base portion. Therefore, the description of the configuration the same as or similar to that of the piezoelectric device 100 according to Preferred Embodiment 1 of the present invention will not be repeated.

Figure 22:
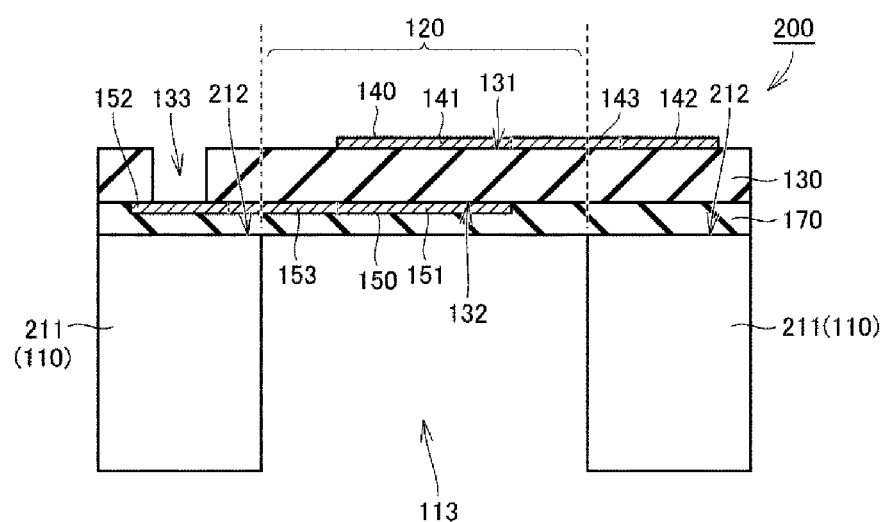
FIG. 22 is a cross-sectional view of a piezoelectric device according to Preferred Embodiment 2 of the present invention.

FIG. 22 is a cross-sectional view of the piezoelectric device according to Preferred Embodiment 2 of the present invention. The cross-sectional view of the piezoelectric device 200 illustrated in FIG. 22 is illustrated in the same or substantially the same as the cross-sectional view of the piezoelectric device 100 illustrated in FIG. 2.

As illustrated in FIG. 22, in the piezoelectric device 200 according to Preferred Embodiment 2 of the present invention, the base portion 110 includes only a first single-crystal silicon layer 211.

In the piezoelectric device 200 according to Preferred Embodiment 2 of the present invention, the intermediate layer 170 is laminated on the upper surface of the base portion 110 so as to cover the upper side of the cavity 113. That is, in the present preferred embodiment, the lower surface of the intermediate layer 170 is exposed in the cavity 113.

Note that the intermediate layer 170 and the first single-crystal silicon layer 211 are not necessarily directly connected to each other, and the intermediate layer 170 and the first single-crystal silicon layer 211 may be connected to each other with a metal layer interposed therebetween.

As described above, in the present preferred embodiment, the membrane portion 120 includes the single-crystal piezoelectric layer 130, the upper electrode layer 140, the lower electrode layer 150, and the intermediate layer 170. The piezoelectric device 200 according to the present preferred embodiment is used as, for example, a bulk acoustic wave (BAW) resonator.

Note that in the piezoelectric device 200 according to Preferred Embodiment 2 of the present invention, the outer shape of each of the upper electrode layer 140 and the lower electrode layer 150 as viewed in the vertical direction is the same or substantially the same as the outer shape of each of the upper electrode layer 140 and the lower electrode layer 150 in any one of the piezoelectric device 100 according to Preferred Embodiment 1 of the present invention and the piezoelectric devices 100a to 100f according to each modification of Preferred Embodiment 1 of the present invention illustrated in FIG. 1 and FIG. 16 to FIG. 21.

In addition, in Preferred Embodiment 2 of the present invention, the first single-crystal silicon layer 211 includes a third surface 212 facing upward. The first single-crystal silicon layer 211 includes a plurality of first silicon cleavage directions extending along a boundary line between a cleavage plane occurring when the first single-crystal silicon layer 211 is cleaved and the third surface 212. Specifically, the first single-crystal silicon layer 211 includes two first silicon cleavage directions. The above-described two first silicon cleavage directions are the same or substantially the same as the two second silicon cleavage directions Cs in each of the piezoelectric device 100 according to Preferred Embodiment 1 of the present invention and the piezoelectric devices 100a to 100f according to each modification of Preferred Embodiment 1 of the present invention illustrated in FIG. 1 and FIG. 16 to FIG. 21.

Therefore, in the piezoelectric device 200 according to Preferred Embodiment 2 of the present invention, each of the plurality of electrode straight portions 140S and 150S is non-parallel to the cleavage direction of the first single-crystal silicon layer 211 when viewed in the vertical direction.

That is, in the present preferred embodiment, at least a portion of the upper electrode outer edge 140E and at least a portion of the lower electrode outer edge 150E are non-parallel to each of the plurality of first silicon cleavage directions. Thus, it is possible to reduce or prevent the occurrence of cracking due to cleavage in the membrane portion 120 along the first silicon cleavage direction of the first single-crystal silicon layer 211 included in the base portion 110. Note that more specifically, the entire or substantially the entire circumference of the upper electrode outer edge 140E and the entire or substantially the entire circumference of the lower electrode outer edge 150E are non-parallel to each of the plurality of first silicon cleavage directions.

Furthermore, in the piezoelectric device 200 according to Preferred Embodiment 2 of the present invention, the shape of the outer edge 120E of the membrane portion 120 when viewed in the vertical direction is the same or substantially the same as the outer edge 120E of the membrane portion 120 in any one of the piezoelectric device 100 according to Preferred Embodiment 1 of the present invention and the piezoelectric devices 100a to 100f according to each modification of Preferred Embodiment 1 of the present invention illustrated in FIG. 1 and FIG. 16 to FIG. 21.

Therefore, in the piezoelectric device 200 according to Preferred Embodiment 2 of the present invention, each of the plurality of membrane straight portions 120S is non-parallel to each of the plurality of first silicon cleavage directions of the first single-crystal silicon layer 211 when viewed in the vertical direction.

That is, in the present preferred embodiment, at least a portion of the outer edge of the membrane portion 120 is non-parallel to each of the plurality of first silicon cleavage directions. Thus, it is possible to reduce or prevent the occurrence of cracking due to cleavage in the membrane portion 120 along the first silicon cleavage direction of the first single-crystal silicon layer 211 included in the base portion 110. More specifically, the entire or substantially the entire circumference of the outer edge of the membrane portion 120 is non-parallel to each of the plurality of first silicon cleavage directions.

In addition, in the piezoelectric device 200 according to Preferred Embodiment 2 of the present invention, at least one direction of the plurality of piezoelectric body cleavage directions Cp is non-parallel to each of the plurality of first silicon cleavage directions of the first single-crystal silicon layer 211. As such, the occurrence of cracking due to cleavage in the single-crystal piezoelectric layer 130 can be reduced or prevented.

More specifically, in the piezoelectric device 200 according to Preferred Embodiment 2 of the present invention, all of the plurality of piezoelectric body cleavage directions Cp are non-parallel to each of the plurality of first silicon cleavage directions of the first single-crystal silicon layer 211. As such, the occurrence of cracking due to cleavage in the single-crystal piezoelectric layer 130 can be further reduced or prevented.

Hereinafter, a non-limiting example of a method for manufacturing the piezoelectric device according to Preferred Embodiment 2 of the present invention will be described. First, in the same or substantially the same manner as in the method for manufacturing the piezoelectric device 100 according to Preferred Embodiment 1 of the present invention, the lower electrode layer 150 and the intermediate layer 170 are provided below the single-crystal piezoelectric layer 130. Thus, layers similar to the plurality of layers illustrated in FIG. 10 are manufactured.

Figure 23:
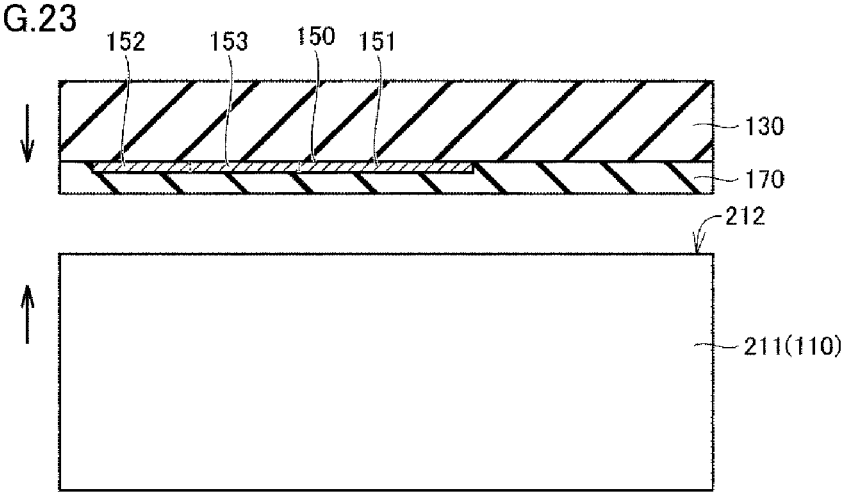
FIG. 23 is a cross-sectional view illustrating a state in which a single-crystal silicon substrate is bonded to the plurality of layers illustrated in FIG. 10 in a method for manufacturing the piezoelectric device according to Preferred Embodiment 2 of the present invention.
Figure 24:
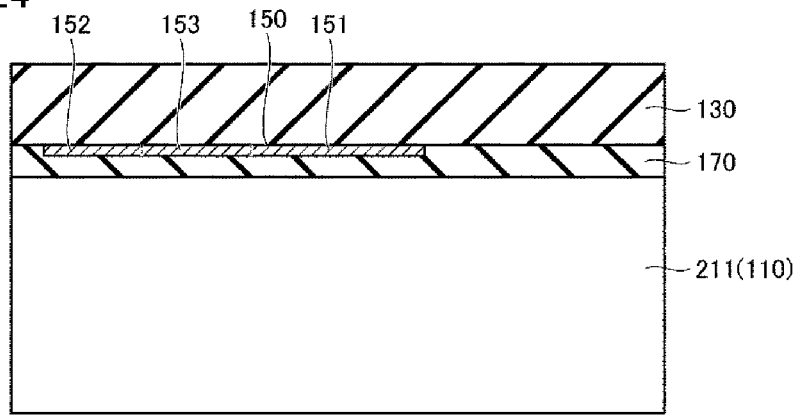
FIG. 24 is a cross-sectional view illustrating a state in which the single-crystal silicon substrate is bonded to the lower surface of the intermediate layer in the method for manufacturing the piezoelectric device according to Preferred Embodiment 2 of the present invention.

FIG. 23 is a cross-sectional view illustrating a state in which a single-crystal silicon substrate is bonded to the plurality of layers illustrated in FIG. 10 in the method for manufacturing the piezoelectric device according to Preferred Embodiment 2 of the present invention. FIG. 24 is a cross-sectional view illustrating a state in which the single-crystal silicon substrate is bonded to a lower surface of an intermediate layer in the method for manufacturing a piezoelectric device according to Preferred Embodiment 2 of the present invention. As illustrated in FIG. 23 and FIG. 24, the single-crystal silicon substrate is bonded to the lower surface of the intermediate layer 170 of the plurality of layers illustrated in FIG. 10. The silicon substrate includes the base portion 110 in which the cavity 113 is not formed, that is, the first single-crystal silicon layer 211.

In the present preferred embodiment, a single-crystal silicon substrate having an orientation flat surface is used as the single-crystal silicon substrate. The above-described orientation flat surface is formed corresponding to two first silicon cleavage directions of the first single-crystal silicon layer 211 formed of a single-crystal silicon substrate. For example, the orientation flat surface is formed on the single-crystal silicon substrate so that the orientation flat surface of the single-crystal silicon substrate and one of the two first silicon cleavage directions are parallel or substantially parallel to each other and the orientation flat surface of the single-crystal silicon substrate and the other one of the two first silicon cleavage directions are orthogonal or substantially orthogonal to each other.

In the case where the orientation flat surface is formed on the single-crystal piezoelectric substrate so that the angle between at least one of the three piezoelectric body cleavage directions Cp and the orientation flat surface of the single-crystal piezoelectric substrate is, for example, equal to or more than about 30 degrees and equal to or less than about 60 degrees, when the single-crystal silicon substrate is bonded to the above-described plurality of layers, the bonding is performed so that the orientation flat surface of the single-crystal silicon substrate and the orientation flat surface of the single-crystal piezoelectric substrate overlap each other in the vertical direction. As a result, each of the plurality of piezoelectric body cleavage directions Cp is non-parallel to each of the plurality of first silicon cleavage directions. In addition, an angle between each of the plurality of first silicon cleavage directions and at least one of the plurality of piezoelectric body cleavage directions Cp is, for example, equal to or more than about 30 degrees and equal to or less than about 60 degrees.

Note that in the single-crystal piezoelectric substrate, in the case where the orientation flat surface is formed on the single-crystal piezoelectric substrate so that at least one of the three piezoelectric body cleavage directions Cp and the orientation flat surface of the single-crystal piezoelectric substrate are orthogonal, substantially orthogonal, parallel, or substantially parallel to each other, bonding is performed so that the orientation flat surface of the single-crystal silicon substrate and the orientation flat surface of the single-crystal piezoelectric substrate do not to overlap each other in the vertical direction. As a result, each of the plurality of piezoelectric body cleavage directions Cp is non-parallel to each of the plurality of first silicon cleavage directions.

Figure 25:
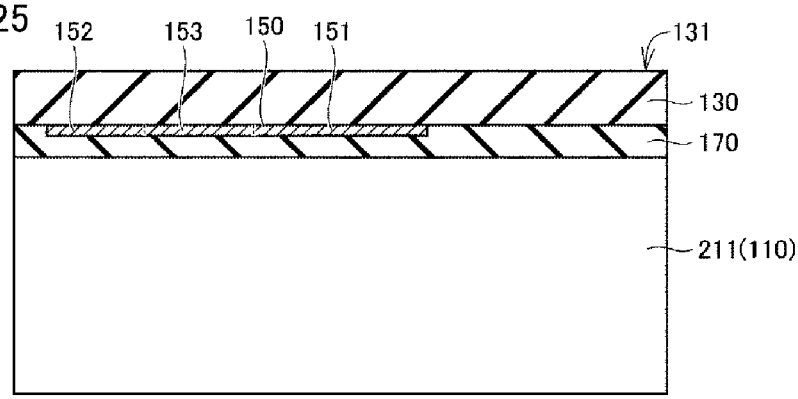
FIG. 25 is a cross-sectional view illustrating a state in which an upper surface of the single-crystal piezoelectric layer is polished in the method for manufacturing the piezoelectric device according to Preferred Embodiment 2 of the present invention.

FIG. 25 is a cross-sectional view illustrating a state in which an upper surface of the single-crystal piezoelectric layer is polished in the method for manufacturing the piezoelectric device according to Preferred Embodiment 2 of the present invention. As illustrated in FIG. 25, the single-crystal piezoelectric layer 130 is formed to have a desired thickness in the same or substantially the same manner as in the method for manufacturing the piezoelectric device 100 according to Preferred Embodiment 1 of the present invention.

Figure 26:
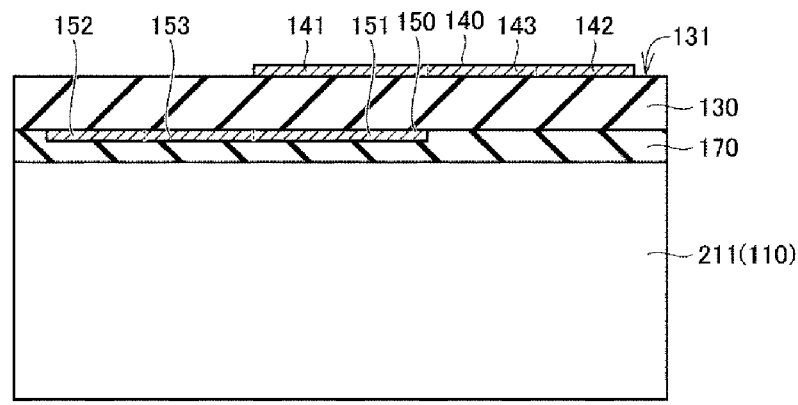
FIG. 26 is a cross-sectional view illustrating a state in which the upper electrode layer is provided on the upper surface of the single-crystal piezoelectric layer in the method for manufacturing the piezoelectric device according to Preferred Embodiment 2 of the present invention.

FIG. 26 is a cross-sectional view illustrating a state in which an upper electrode layer is provided on the upper surface of the single-crystal piezoelectric layer in the method for manufacturing the piezoelectric device according to Preferred Embodiment 2 of the present invention. As illustrated in FIG. 26, in the same or substantially the same manner as in the method for manufacturing the piezoelectric device 100 according to Preferred Embodiment 1 of the present invention, the upper electrode layer 140 is provided on the first surface 131 that is the upper surface of the single-crystal piezoelectric layer 130.

Figure 27:
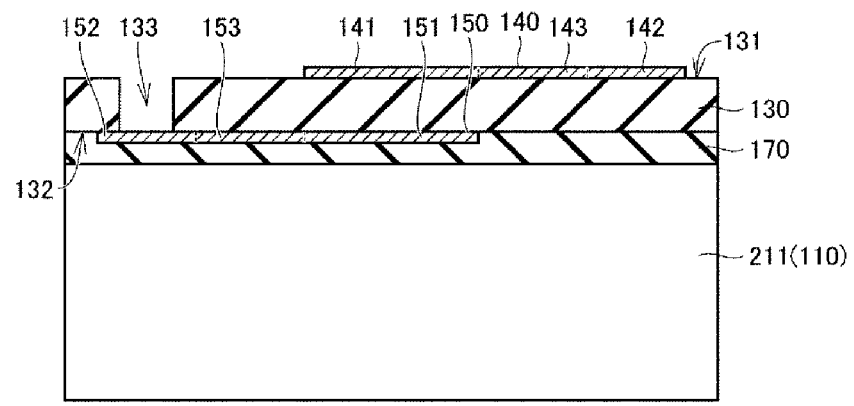
FIG. 27 is a cross-sectional view illustrating a state in which a through-hole is provided in a single-crystal piezoelectric layer in the method for manufacturing the piezoelectric device according to Preferred Embodiment 2 of the present invention.

FIG. 27 is a cross-sectional view illustrating a state in which a through-hole is provided in the single-crystal piezoelectric layer in the method for manufacturing the piezoelectric device according to Preferred Embodiment 2 of the present invention. As illustrated in FIG. 27, the through-hole 133 is formed in the same or substantially the same manner as in the method for manufacturing the piezoelectric device 100 according to Preferred Embodiment 1 of the present invention.

Finally, the cavity 113 is formed in the base portion 110 by, for example, deep reactive ion etching or the like with respect to the base portion 110 from the lower surface side of the base portion 110. Thus, the membrane portion 120 illustrated in FIG. 22 is formed, and the piezoelectric device 200 according to Preferred Embodiment 2 of the present invention as illustrated in FIG. 22 is manufactured. Note that the cavity 113 may be formed so that the upper end of the cavity 113 is formed of the first single-crystal silicon layer 211. In this case, the membrane portion 120 includes the first single-crystal silicon layer 221.

Preferred Embodiment 3

Hereinafter, a piezoelectric device according to Preferred Embodiment 3 of the present invention will be described.

The piezoelectric device according to Preferred Embodiment 3 of the present invention differs from the piezoelectric device 100 according to Preferred Embodiment 1 of the present invention in that a close contact layer is provided. Therefore, the description of the configuration the same as or similar to that of the piezoelectric device 100 according to Preferred Embodiment 1 of the present invention will not be repeated.

Figure 28:
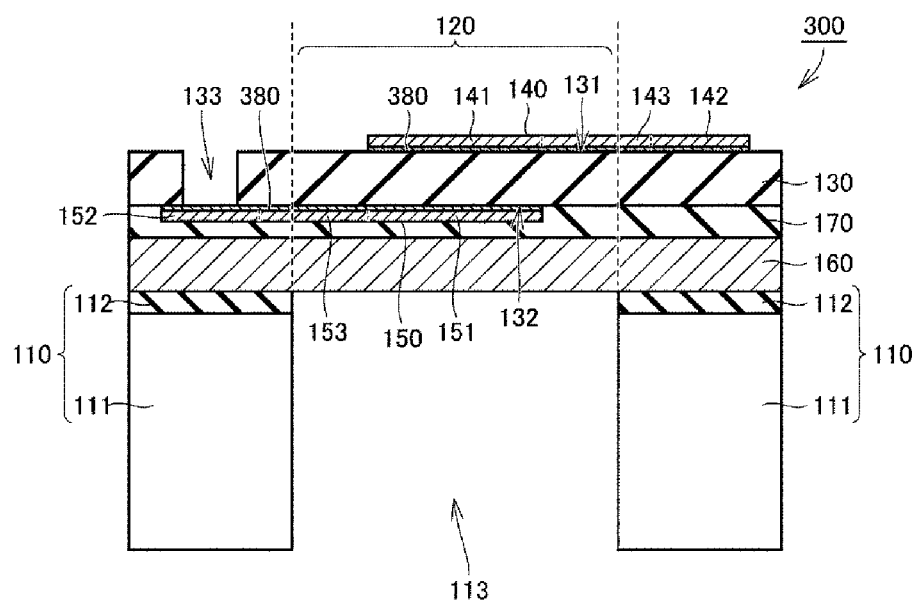
FIG. 28 is a cross-sectional view of a piezoelectric device according to Preferred Embodiment 3 of the present invention.

FIG. 28 is a cross-sectional view of the piezoelectric device according to Preferred Embodiment 3 of the present invention. The cross-sectional view of a piezoelectric device 300 illustrated in FIG. 28 is illustrated in the same or substantially the same as the cross-sectional view of the piezoelectric device 100 illustrated in FIG. 2.

As illustrated in FIG. 28, in the piezoelectric device 300 according to Preferred Embodiment 3 of the present invention, a close contact layer 380 is positioned between the upper electrode layer 140 and the single-crystal piezoelectric layer 130. The upper electrode layer 140 is connected to the single-crystal piezoelectric layer 130 with the close contact layer 380 interposed therebetween. In addition, the close contact layer 380 is also provided between the lower electrode layer 150 and the single-crystal piezoelectric layer 130. The lower electrode layer 150 is connected to the single-crystal piezoelectric layer 130 with the close contact layer 380 interposed therebetween.

As described above, in the piezoelectric device 300 according to Preferred Embodiment 3 of the present invention, the close contact layer 380 is positioned at least one of between the upper electrode layer 140 and the single-crystal piezoelectric layer 130 and between the lower electrode layer 150 and the single-crystal piezoelectric layer 130.

In the present preferred embodiment, the occurrence of cracking due to cleavage of the single-crystal piezoelectric layer 130 is reduced or prevented by the same or substantially the same configuration as that of the piezoelectric device 100 according to Preferred Embodiment 1 of the present invention. Therefore, a material that causes a relatively high residual stress in the single-crystal piezoelectric layer 130 can be used as a material forming the close contact layer 380.

Therefore, in the present preferred embodiment, the close contact layer 380 is made of, for example, a NiCr alloy. In the present preferred embodiment, the close contact layer 380 is made of, for example, a NiCr alloy, which is a material causing a relatively high residual stress, thus improving electrical characteristics of the piezoelectric device 300.

For example, a NiCr alloy has a property of being less prone to atomic diffusion into lithium niobate than Ti. Therefore, in the piezoelectric device 300 including the single-crystal piezoelectric layer 130 made of lithium niobate, the close contact layer 380 is made of, for example, a NiCr alloy, such that the reliability of the piezoelectric device 300 can be improved as compared with a piezoelectric device in which the close contact layer is made of Ti.

In the description of the above-described preferred embodiments, configurations that can be combined may be combined with each other. As the cleavage direction of the single-crystal silicon layer, the angle between each of the plurality of second silicon cleavage directions Cs or the first silicon cleavage directions and each of the plurality of piezoelectric body cleavage directions Cp is not limited to equal to or more than about 30 degrees and equal to or less than about 60 degrees and only need to be non-parallel. In addition, in the present specification, a curved line and a straight line are always "non-parallel" to each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a base portion; and
a membrane portion indirectly supported by the base portion, positioned above the base portion, and including a plurality of layers; wherein
the membrane portion does not overlap the base portion and includes a single-crystal piezoelectric layer including a first surface facing upward and a second surface on a side opposite to the first surface in a vertical direction, an upper electrode layer on the first surface, and a lower electrode layer on the second surface so as to face at least a portion of the upper electrode layer sandwiching the single-crystal piezoelectric layer in between;
the single-crystal piezoelectric layer is made of lithium tantalate or lithium niobate and includes a plurality of piezoelectric body cleavage directions extending along a boundary line between a cleavage plane occurring when the single-crystal piezoelectric layer is cleaved and the first surface; and
when viewed in the vertical direction, at least a portion of an upper electrode outer edge that is an outer edge of the upper electrode layer and at least a portion of a lower electrode outer edge that is an outer edge of the lower electrode layer are non-parallel to at least one direction of the plurality of piezoelectric body cleavage directions.

2. The piezoelectric device according to claim 1, wherein an entire or substantially an entire circumference of the upper electrode outer edge and an entire or substantially an entire circumference of the lower electrode outer edge are non-parallel to at least one direction of the plurality of piezoelectric body cleavage directions when viewed in the vertical direction.

3. The piezoelectric device according to claim 1, wherein at least a portion of the upper electrode outer edge and at least a portion of the lower electrode outer edge are non-parallel to any of the plurality of piezoelectric body cleavage directions when viewed in the vertical direction.

4. The piezoelectric device according to claim 1, wherein an entire or substantially an entire circumference of the upper electrode outer edge and an entire or substantially an entire circumference of the lower electrode outer edge are non-parallel to any of the plurality of piezoelectric body cleavage directions when viewed in the vertical direction.

5. The piezoelectric device according to claim 1, wherein
the upper electrode outer edge and the lower electrode outer edge each include a plurality of electrode straight portions extending in a straight-line shape when viewed in the vertical direction; and
at least a portion of the plurality of electrode straight portions is non-parallel to at least one direction of the plurality of piezoelectric body cleavage directions when viewed in the vertical direction.

6. The piezoelectric device according to claim 5, wherein all of the plurality of electrode straight portions are non-parallel to at least one direction of the plurality of piezoelectric body cleavage directions when viewed in the vertical direction.

7. The piezoelectric device according to claim 1, wherein the upper electrode outer edge and the lower electrode outer edge each include only a plurality of electrode curved portions extending in a curved-line shape when viewed in the vertical direction.

8. The piezoelectric device according to claim 1, wherein
the membrane portion further includes a second single-crystal silicon layer below the lower electrode layer,
the second single-crystal silicon layer includes a fourth surface facing upward and a plurality of second silicon cleavage directions extending along a boundary line between a cleavage plane occurring when the second single-crystal silicon layer is cleaved and the fourth surface; and
at least a portion of the upper electrode outer edge and at least a portion of the lower electrode outer edge are non-parallel to each of the plurality of second silicon cleavage directions when viewed in the vertical direction.

9. The piezoelectric device according to claim 1, wherein
the membrane portion further includes a second single-crystal silicon layer below the lower electrode layer;
the second single-crystal silicon layer includes a fourth surface facing upward and a plurality of second silicon cleavage directions extending along a boundary line between a cleavage plane occurring when the second single-crystal silicon layer is cleaved and the fourth surface;
the membrane portion surrounded by the base portion when viewed in the vertical direction; and
at least a portion of an outer edge of the membrane portion is non-parallel to each of the plurality of second silicon cleavage directions when viewed in the vertical direction.

10. The piezoelectric device according to claim 1, wherein
the base portion includes a first single-crystal silicon layer;
the first single-crystal silicon layer includes a third surface facing upward and a plurality of first silicon cleavage directions extending along a boundary line between a cleavage plane occurring when the first single-crystal silicon layer is cleaved and the third surface; and
at least a portion of the upper electrode outer edge and at least a portion of the lower electrode outer edge are positioned non-parallel to each of the plurality of first silicon cleavage directions when viewed in the vertical direction.

11. The piezoelectric device according to claim 1, wherein
the base portion includes a first single-crystal silicon layer;
the first single-crystal silicon layer includes a third surface facing upward and a plurality of first silicon cleavage directions extending along a boundary line between a cleavage plane occurring when the first single-crystal silicon layer is cleaved and the third surface;
the membrane portion is surrounded by the base portion when viewed in the a vertical direction; and
at least a portion of an outer edge of the membrane portion is non-parallel to each of the plurality of first silicon cleavage directions when viewed in the vertical direction.

12. The piezoelectric device according to claim 1, wherein
a close contact layer is provided at at least one of between the upper electrode layer and the single-crystal piezoelectric layer and between the lower electrode layer and the single-crystal piezoelectric layer; and
the close contact layer is made of a NiCr alloy.

13. The piezoelectric device according to claim 1, wherein a portion in each of the upper electrode layer and the lower electrode layer, which is in contact with the single-crystal piezoelectric layer, is an epitaxial growth film provided on the single-crystal piezoelectric layer.

14. The piezoelectric device according to claim 1, wherein
at least one of the base portion and the membrane portion includes a single-crystal silicon layer;
the single-crystal silicon layer includes an upper surface facing upward and a plurality of silicon cleavage directions extending along a boundary line between a cleavage plane occurring when the single-crystal silicon layer is cleaved and the upper surface; and
at least one direction of the plurality of piezoelectric body cleavage directions is non-parallel to each of the plurality of silicon cleavage directions.

15. A piezoelectric device comprising:
a base portion; and
a membrane portion indirectly supported by the base portion, positioned above the base portion, and including a plurality of layers; wherein
the membrane portion does not overlap the base portion and includes a single-crystal piezoelectric layer including a first surface facing upward and a second surface on a side opposite to the first surface in a vertical direction, an upper electrode layer on the first surface, and a lower electrode layer on the second surface so as to face at least a portion of the upper electrode layer sandwiching the single-crystal piezoelectric layer in between;
the single-crystal piezoelectric layer is made of lithium tantalate or lithium niobate and includes a plurality of piezoelectric body cleavage directions extending along a boundary line between a cleavage plane occurring when the single-crystal piezoelectric layer is cleaved and the first surface;
at least one of the base portion and the membrane portion includes a single-crystal silicon layer;
the single-crystal silicon layer includes an upper surface facing upward and a plurality of silicon cleavage directions extending along a boundary line between a cleavage plane occurring when the single-crystal silicon layer is cleaved and the upper surface; and
at least one direction of the plurality of piezoelectric body cleavage directions is non-parallel to each of the plurality of silicon cleavage directions.

16. The piezoelectric device according to claim 15, wherein an entire or substantially an entire circumference of the upper electrode outer edge and an entire or substantially an entire circumference of the lower electrode outer edge are non-parallel to at least one direction of the plurality of piezoelectric body cleavage directions when viewed in the vertical direction.

17. The piezoelectric device according to claim 15, wherein at least a portion of the upper electrode outer edge and at least a portion of the lower electrode outer edge are non-parallel to any of the plurality of piezoelectric body cleavage directions when viewed in the vertical direction.

18. The piezoelectric device according to claim 15, wherein an entire or substantially an entire circumference of the upper electrode outer edge and an entire or substantially an entire circumference of the lower electrode outer edge are non-parallel to any of the plurality of piezoelectric body cleavage directions when viewed in the vertical direction.

19. The piezoelectric device according to claim 15, wherein the upper electrode outer edge and the lower electrode outer edge each include a plurality of electrode straight portions extending in a straight-line shape when viewed in the vertical direction; and at least a portion of the plurality of electrode straight portions is non-parallel to at least one direction of the plurality of piezoelectric body cleavage directions when viewed in the vertical direction.

20. The piezoelectric device according to claim 19, wherein all of the plurality of electrode straight portions are non-parallel to at least one direction of the plurality of piezoelectric body cleavage directions when viewed in the vertical direction.

* * * * *